US008015457B2

(12) United States Patent
Koshikawa et al.

(10) Patent No.: US 8,015,457 B2
(45) Date of Patent: Sep. 6, 2011

(54) REDUNDANCY CIRCUIT AND SEMICONDUCTOR MEMORY DEVICE

(75) Inventors: Yasuji Koshikawa, Tokyo (JP); Yousuke Kawamata, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 644 days.

(21) Appl. No.: 12/000,373

(22) Filed: Dec. 12, 2007

(65) Prior Publication Data

US 2008/0144410 A1 Jun. 19, 2008

(30) Foreign Application Priority Data

Dec. 13, 2006 (JP) ................................. 2006-335802

(51) Int. Cl.
G11C 29/44 (2006.01)
G11C 29/50 (2006.01)

(52) U.S. Cl. ........................................ 714/710; 714/718
(58) Field of Classification Search ......................... None
See application file for complete search history.

(56) References Cited

U.S. PATENT DOCUMENTS

| 5,822,257 | A * | 10/1998 | Ogawa ........................... 365/200 |
| 6,052,767 | A * | 4/2000 | Matuki ........................... 711/202 |
| 6,191,974 | B1 * | 2/2001 | Nishida et al. ............ 365/185.11 |
| 6,930,935 | B2 | 8/2005 | Nanba et al. |
| 7,548,842 | B2 * | 6/2009 | Ganesan et al. ................ 703/14 |
| 2003/0174566 | A1 * | 9/2003 | Furutani et al. ............... 365/201 |
| 2004/0047221 | A1 * | 3/2004 | Tanaka .......................... 365/222 |

FOREIGN PATENT DOCUMENTS

| JP | 48-077358 | 10/1973 |
| JP | 61-202244 | 9/1986 |
| JP | 63-049933 | 10/1988 |
| JP | 02-079135 | 3/1990 |
| JP | 02-281344 | 11/1990 |
| JP | 08-016434 | 1/1996 |
| JP | 2004-296051 A | 10/2004 |
| JP | 2006-107664 A | 4/2006 |

* cited by examiner

Primary Examiner — Jeffrey A Gaffin
Assistant Examiner — Dipakkumar Gandhi
(74) Attorney, Agent, or Firm — Foley & Lardner LLP

(57) ABSTRACT

Disclosed is a circuit for deciding whether or not a plural number of redundancy ROM circuits have been programmed in a preset order, with regards to addresses. In at least one of first to n-th redundancy memory circuits, an address to be substituted by a redundant address is recorded and a redundancy selection signal is output when an access address is coincident with the programmed address. It is presupposed that repair addresses are programmed from the first to the n-th redundancy ROM circuits in an ascending order with regards to address. If it is detected under this condition that a redundancy selection signal has been output from the i+1'st redundancy memory circuit while no redundancy selection signal is being output from the i-th redundancy memory circuit, an SR flip-flop is set and the sequence of the substitution decision outputs is decided to be a reversed sequence.

9 Claims, 10 Drawing Sheets

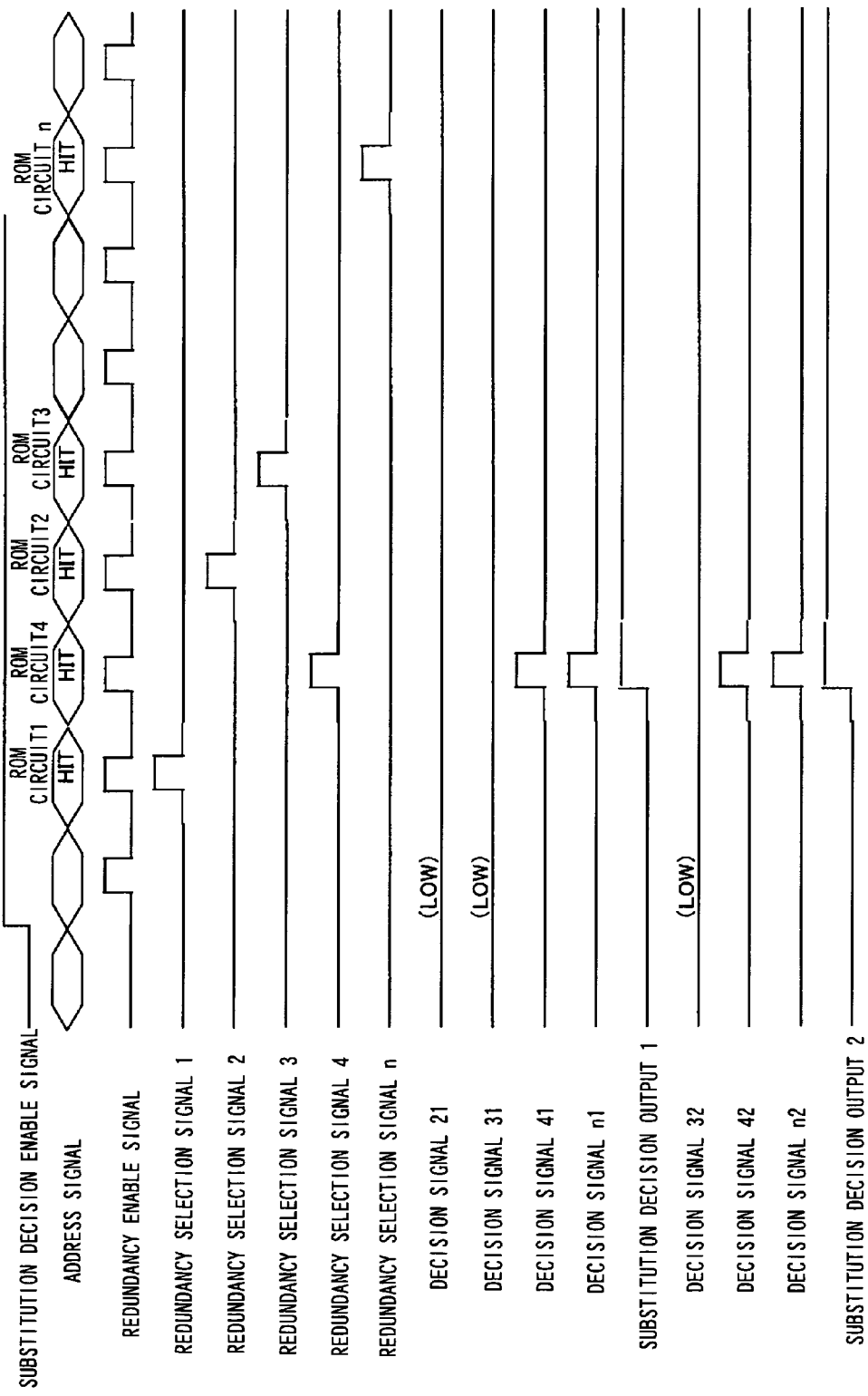

REDUNDANCY CIRCUIT AND SEMICONDUCTOR MEMORY DEVICE

REFERENCE TO RELATED APPLICATION

The present application is claiming the priority of the earlier Japanese patent application No. 2006-335802 filed on Dec. 13, 2006, the entire disclosure thereof being incorporated herein by reference thereto.

FIELD OF THE INVENTION

This invention relates to a semiconductor device and, more particularly, to a test technique for a semiconductor device in which addresses to be replaced by redundancy cells are programmed by, for example, laser cutting.

BACKGROUND OF THE INVENTION

In a memory, such as a random access memory (RAM), or a semiconductor integrated circuit equipped with a RAM, a spare memory area (redundancy area), is provided from the outset, for the columns and/or rows in a memory cell array, and failed cells of the memory cell array, detected by a wafer test, for example, are replaced by redundancy cells, thereby repairing failed bits and improving device yield. In order to enable a plural number each of row addresses and column addresses to be repaired, a plural number of redundancy addresses are provided for rows and for columns, respectively.

A plural number of redundancy ROM (Read Only Memory) circuits are provided corresponding to a plural number of redundant addresses, respectively. In one redundancy ROM circuit, there is recorded the information of one address, which is a row address or a column address, also termed a repair address, which is to be replaced by a redundant address. In programming the redundancy ROM circuit, those fuses corresponding to bit positions of address bits of the address information in the redundancy ROM circuit, out of a plural number of fuses corresponding to the number of bits of the address information in the redundancy ROM circuit, are blown by a laser beam. For example, the fuse corresponding to the bit with an address value of 1 is blown, while the fuse corresponding to the bit with an address value of 0 is unblown. The value of the fuse circuit blown is read out e.g. to a HIGH level, while that of the fuse circuit unblown is read out e.g. to a LOW level.

If, during the use of the memory, a redundancy enable signal is activated by, for example, an external command, the access address supplied from outside, is checked as to whether or not it is coincident with the address information programmed in the redundancy ROM circuit. In case of coincidence, a hit signal (redundancy selection signal) is activated, and the redundant address, associated with the activated redundancy selection signal, is selected. If the redundancy address is selected, address decoding by a row or column decoder is halted and the redundancy address of the row or the column associated with the redundancy selection signal is selected. If the redundancy enable signal has been activated and the accessed address is not coincident with any address information programmed in the plural number of the redundancy ROM circuits, the normal access to the normal memory array is performed.

Meanwhile, the general configuration of the redundancy ROM circuit, and the RAM, including the redundancy ROM circuit, is well-known to those skilled in the art. Reference may be made to the description of Patent Publication 1 of the present Assignee as for the overall configuration of a semiconductor memory having a redundancy circuit, a redundancy decoder, a redundancy ROM circuit (fuse ROM) or a decoder killer circuit. Hence, in the present specification, the description of the redundancy ROM circuit based on drawings is dispensed with.

Up to now, it has been practiced to check if the input address is to be replaced by the redundant address, using a roll call test and the like. Patent Publication 2 discloses a constitution as a semiconductor memory device for checking if the fuses of a redundancy circuit have been set to correct states, in which the program information of the fuses provided in the redundancy circuit is checked in the second roll call test mode and the results of the check are output to an output terminal.

[Patent Publication 1] JP Patent Kokai Publication No. JP-P2004-296051A

[Patent Publication 2] JP Patent Kokai Publication No. JP-P2006-107664A

SUMMARY OF THE DISCLOSURE

The following analysis is given by the present invention. The entire disclosures of the above mentioned Patent Documents are herein incorporated by reference thereto.

In the semiconductor memory device, up to now, there lacks a means for verifying whether or not a plural number of fuse ROMs, programmed by e.g., laser cutting, have been programmed in a preset order with regards to address. Recently, with progress towards miniaturization and higher integration of semiconductor devices, the fuse circuit of the redundancy ROM circuit is shrinking in dimension. Thus, there may be cases where a fuses other than fuses to be blown is erroneously blown, or fuses to be blown remain unblown, in programming of the redundancy ROM circuit. Up to now, there lack suitable means to detect these errors. For example, it is assumed that an address to be programmed in the redundancy ROM circuit (repair address) is in ten bits of "0101001011" and the fuse of the bit neighboring to the MSB (Most Significant Bit) is to be blown, where the fuse blown indicates 1. If the fuse for the MSB is erroneously blown, the address becomes "1001001011", and hence an address different from the failed address is replaced by the redundant address. In this case, the repair of the failed address is not performed and the device is regarded as a fail device in e.g. a production test.

Accordingly, it is an object of the present invention to provide a circuit which enables to decide whether or not plural redundancy ROM circuits have been programmed in a preset order with regards to address, and a semiconductor device having such circuit.

The invention disclosed in the present application has substantially the following constitution.

In accordance with one aspect of the present invention, there is provided a redundancy circuit comprising a plurality of redundancy memory circuits each having address information to be substituted by a redundant address programmed therein and each outputting a redundancy selection signal in an activated state when an input address coincides with the address information programmed; wherein the order as to largeness/smallness of addresses programmed respectively in said redundancy memory circuits corresponds to a predetermined numbering order of said redundancy memory circuits; and the input addresses in accordance with said order are sequentially applied in common to said redundancy memory circuits. A sequence in which, before one redundancy memory circuit outputs a redundancy selection signal in an activated state, the other redundancy memory circuit, associated with said one redundancy memory circuit, outputs a redundancy selection signal in an activated state, is a normal order, with regards to the input address supplied in common and the address information programmed in said redundancy memory circuits. The redundancy circuit further comprising a decision circuit provided at least for said one redundancy memory circuit; said decision circuit receiving the redundancy selection signal from said one redundancy memory circuit and information indicating whether or not said redundancy selection signal in the activated state has already been output from said other redundancy memory circuit. Said decision circuit, when detecting a state, in which the redundancy selection signal in the activated state has not been output from said other redundancy memory circuit when the redundancy selection signal in the activated state has been output from said one redundancy memory circuit, decides the state to be a reverse order state, and outputs a decision result.

In another aspect, the present invention provides a redundancy memory circuit comprising:

a plurality of redundancy memory circuits each having the address information to be substituted by a redundant address programmed therein and each outputting a redundancy selection signal in an activated state when an input address coincides with the programmed address information; wherein said redundancy memory circuits are juxtaposed and are numbered from one side in an ascending order;

addresses are programmed in an ascending order respectively in said redundancy memory circuits in accordance with numbers allotted in an ascending order to said redundancy memory circuits;

addresses are supplied in an ascending order to said redundancy memory circuits in common; and the sequence in which, before the redundancy selection signal in the activated state is output from one redundancy memory circuit, the redundancy selection signal in the activated state is output from other redundancy memory circuit having the younger number than the number of said one redundancy memory circuit, is a normal order; and a decision circuit provided for at least said one redundancy memory circuit, said decision circuit receiving the redundancy selection signal from said one redundancy memory circuit, and the information indicating whether or not the redundancy selection signal in the activated state has already been output from the redundancy memory circuit having the number younger than the number of said one redundancy memory circuit; said decision circuit judging that the sequence is the reverse order when the redundancy selection signal in the activated state has not been output from said other redundancy memory circuit when the redundancy selection signal in the activated state has been output from said one redundancy memory circuit.

In the redundancy memory circuit according to the present invention, the decision circuit includes, in association with said other redundancy memory circuit, an SR flip-flop being set or reset based on a control signal controlling a substitution decision test and on the redundancy selection signal from said other redundancy memory circuit. The SR flip-flop is set at least before said control signal is activated and an output of said SR flip-flop is reset when said control signal is in the activated state and when the redundancy selection signal in the activated state is output from said other redundancy memory circuit. The decision circuit further includes a logic circuit receiving the redundancy selection signal from said one redundancy memory circuit and an output signal of said SR flip-flop associated with said other redundancy memory circuit. The logic circuit decides the sequence state to be the reverse state when both the two signals received are in the activated state.

The redundancy memory circuit according to the present invention comprises a latch circuit for holding the reverse state initially detected by the decision circuit.

In accordance with a further aspect of the present invention, there is provided a redundancy circuit including first to n-th redundancy ROM circuits in which the address information to be substituted by a redundant address has been programmed and which outputs a redundancy selection signal in an activated state when an input address coincides with the programmed address information, where n is an integer equal to or greater than 2, and first to n-th SR flip-flops associated with the first to n-th redundancy memory circuits, respectively. The first to n-th SR flip-flops are set and reset by a substitution decision enable signal controlling a substitution decision test and by redundancy selection signals from the first to n-th redundancy memory circuits. Outputs of the first to n-th SR flip-flops are set to an activated state before the substitution decision enable signal is in an activated state. Outputs of the SR flip-flops, associated with the redundancy memory circuits, are reset if, in the activated state of the substitution decision enable signal, a redundancy selection signal is output from the redundancy memory circuit. The redundancy circuit according to the present invention also includes first to (n−1)th logic circuits, associated with second to n-th redundancy memory circuits, respectively, each logic circuit receiving, as first and second input signals, a redundancy selection signal from each of the second to n-th redundancy memory circuits and an output of the SR flip-flop associated with the redundancy memory circuit of the previous stage. The first to (n−1)th logic circuits each output a decision signal in an activated state if the first and second input signals are both in the activated state, while outputting a decision signal in an activated state otherwise. The redundancy circuit according to the present invention also includes an n-th logic circuit receiving decision signals from the first to (n−1)th logic circuits to output a signal in an activated state and a signal in an inactivated state if the decision signals are all in inactivated state and at least one of the decision signals is in an activated state, respectively. The redundancy circuit according to the present invention also includes an SR flip-flop, as a substitution decision latch, set and reset by an output of the n-th logic circuit and by the substitution decision enable signal, respectively. An output of the SR flip-flop as substitution decision latch is a substitution decision result. The SR flip-flop as substitution decision latch is reset before the substitution decision enable signal is activated and has an output set to an activated state in case the substitution decision enable signal is in the activated state and the output of the n-th logic circuit is in the inactivated state.

In accordance with a further aspect of the present invention, there is provided a redundancy circuit including first to n-th redundancy memory circuits each having the address information to be substituted by a redundant address programmed therein and each outputting a redundancy selection signal in an activated state when an input address coincides with the programmed address information, where n is an integer equal to or greater than 2. The redundancy circuit according to the present invention also includes first to n-th SR flip-flops associated with the first to n-th redundancy memory circuits, respectively. The first to n-th SR flip-flops are reset and set by a substitution decision enable signal controlling the substitution decision test and by redundancy selection signals from the first to n-th redundancy memory circuits, respectively. Outputs of the first to n-th SR flip-flops are set to an activated state in case the substitution decision enable signal is in an inactivated state. Outputs of the SR flip-flops, associated with the redundancy memory circuits, are reset if, in the activated state of the substitution decision enable signal, a redundancy selection signal in an activated state is output from the redundancy memory circuit. The redundancy circuit according to the present invention also includes first to (n−1)th logic circuits, associated with second to n-th redundancy memory circuits, respectively, each logic circuit receiving, as first and second input signals, a redundancy selection signal from each of the second to n-th redundancy memory circuits and an output of the SR flip-flop associated with the redundancy memory circuit of the previous stage. The first to (n−1)th logic circuits each output a decision signal in an activated state if the first and second input signals are both in the activated state, while outputting a decision signal in an inactivated state otherwise. An output of the first logic circuit, associated with the second redundancy memory circuit, is to be a second decision signal. The redundancy circuit according to the present invention also includes first to (n−2)th another logic circuits, first to (n−2)th another logic circuits, wherein the (i−1) another logic circuit takes a logical OR of an i-th decision signal and an output of an i-th logic circuit associated with said (i+1)th redundancy memory circuit, where $2 \leq i \leq n-1$. Outputs of the i-th to (n−2)th another logic circuits are third to n-th decision signals, respectively. The redundancy circuit according to the present invention also includes an SR flip-flop, as a substitution decision latch, set and reset by the n-th decision signal and by the substitution decision enable signal, respectively, and having an output as substitution decision result. The SR flip-flop has the output reset before the substitution decision enable signal becomes activated, and set to an activated state when the substitution decision enable signal is in an activated state and the n-th decision signal is in an activated state.

The redundancy circuit according to the present invention further includes first to (n−1)th logic circuits provided in a distinct path, associated with 3rd to n-th redundancy memory circuits, wherein the (j−2)th logic circuit in the distinct path receives a redundancy selection signal of the j-th redundancy memory circuit and an output of the SR flip-flop associated with the (j−2)th redundancy memory circuit, as first and second input signals, and outputs a decision signal in an activated state when the first and second input signals are both in the activated state, while outputting a decision signal in an inactivated state otherwise, where $3 \leq j \leq n$. An output of the first logic circuit in said distinct path, associated with said third redundancy memory circuit, is to be a third decision signal in the distinct path. The redundancy circuit according to the present invention further includes first to (n−3)th another logic circuits provided in the distinct path, wherein the (i−2)th another logic circuit takes a logical OR of an i-th decision signal in the distinct path and an output of an i-th logic circuit associated with an (i+1)th redundancy memory circuit, where $3 \leq i \leq n-1$. Outputs of the first to (n−3)th logic circuits in the distinct path are to be fourth to n-th decision signals. The redundancy circuit according to the present invention further includes a second SR flip-flop, as a substitution decision latch, set and reset based on the n-th decision signal and on the substitution decision enable signal. An output of the second SR flip-flop is to be a substitution decision result. The second SR flip-flop has an output reset before the substitution decision enable signal is in an activated state. The second SR flip-flop has the output set to an activated state in case the substitution decision enable signal is in the activated state and the n-th decision signal is in the activated state.

In the redundancy circuit according to the present invention, the redundancy memory circuit records the binary bit information based on whether or not the fuse has been blown.

In the redundancy circuit according to the present invention, the redundancy memory circuit receives a redundancy enable signal that control whether or not redundancy substitution is to be made. The redundancy selection signal is activated in case the redundancy enable signal is in an activated state and the input address coincides with the programmed address information.

The semiconductor memory device according to the present invention includes the above-described redundancy circuit. The address programmed in the redundancy memory circuit is a column address or a row address of an object of substitution.

In accordance with a further aspect of the present invention, there is provided a decision circuit deciding whether or not there is sequence reversal in the outputting sequence of output signals from a plurality of circuits outputting the output signals in the activated state in a preset sequence, based on an input signal. The decision circuit includes first to n-th SR flip-flops, associated with first to n-th circuits. The first to n-th SR flip-flops are reset and set based on a decision enable signal controlling the decision on reversal and output signals from the first to n-th circuits. Outputs of the first to n-th SR flip-flops are set to activated states before the decision enable signal is activated. If the decision enable signal is activated, and the output signal in the activated state is output from the circuit, an output of the SR flip-flop, associated with the circuit, is reset. The decision circuit according to the present invention also includes first to (n−1)th logic circuits associated with second to n-th circuits, respectively. The first to (n−1)th logic circuits receive an output signal from the circuit and an output of the SR flip-flop associated with the circuit of the previous stage, as first and second input signals. The first to (n−1)th logic circuits output a decision signal in the activated state in case the first and second input signals are both in the activated state, while outputting a decision signal in the inactivated state otherwise. The decision circuit according to the present invention also includes an n-th logic circuit receiving decision signals from the first to (n−1)th logic circuits and outputting a signal in the activated state and a signal in the inactivated state if the decision signals are all in the inactivated state and if at least one of the decision signals is in the inactivated state, respectively. The decision circuit according to the present invention further includes an SR flip-flop set and reset based on an output of the n-th logic circuit and on the decision enable signal. An output of the SR flip-flop becomes a decision result. The SR flip-flop is reset before the decision enable signal is in an activated state. The SR flip-flop has an output set to the activated state in case the decision enable signal is in an activated state and the output of the n-th logic circuit is in the inactivated state.

The meritorious effects of the present invention are summarized as follows.

According to the present invention, a plural number of redundancy ROM circuits are checked as to if they are programmed in a preset order with regards to address to detect possible programming errors.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications

BRIEF DESCRIPTION OF THE DRAWINGS

FIG. 10 is a timing diagram showing yet another example of the operation of the third example of the present invention.

PREFERRED MODES OF THE INVENTION

According to the present invention, a plural number of redundancy memory circuits, in which addresses replaced by redundant addresses (repair addresses) are programmed based on whether or not fuses are blown, are provided in association with the same plural number of redundant addresses. The redundancy memory circuit outputs a redundancy selection signal if, in using the memory, an access address coincide with the programmed address information in the redundancy memory circuit. If, under the condition that a plurality of redundancy memory circuits are numbered in an ascending order from one end side and that the redundancy substitution is carried out in an ascending order with regards to address, a redundancy selection signal is output from one redundancy memory circuit in a state a redundancy selection signal has already been output from the redundancy memory circuit smaller in number than the one redundancy memory circuit, this sequence is decided to a normal order. If a redundancy selection signal is output from the one redundancy memory circuit in a state a redundancy selection signal has not been output from the redundancy memory circuit, the number of which is less than that of the one redundancy memory circuit, this sequence is detected as a reverse order.

Figure 1:
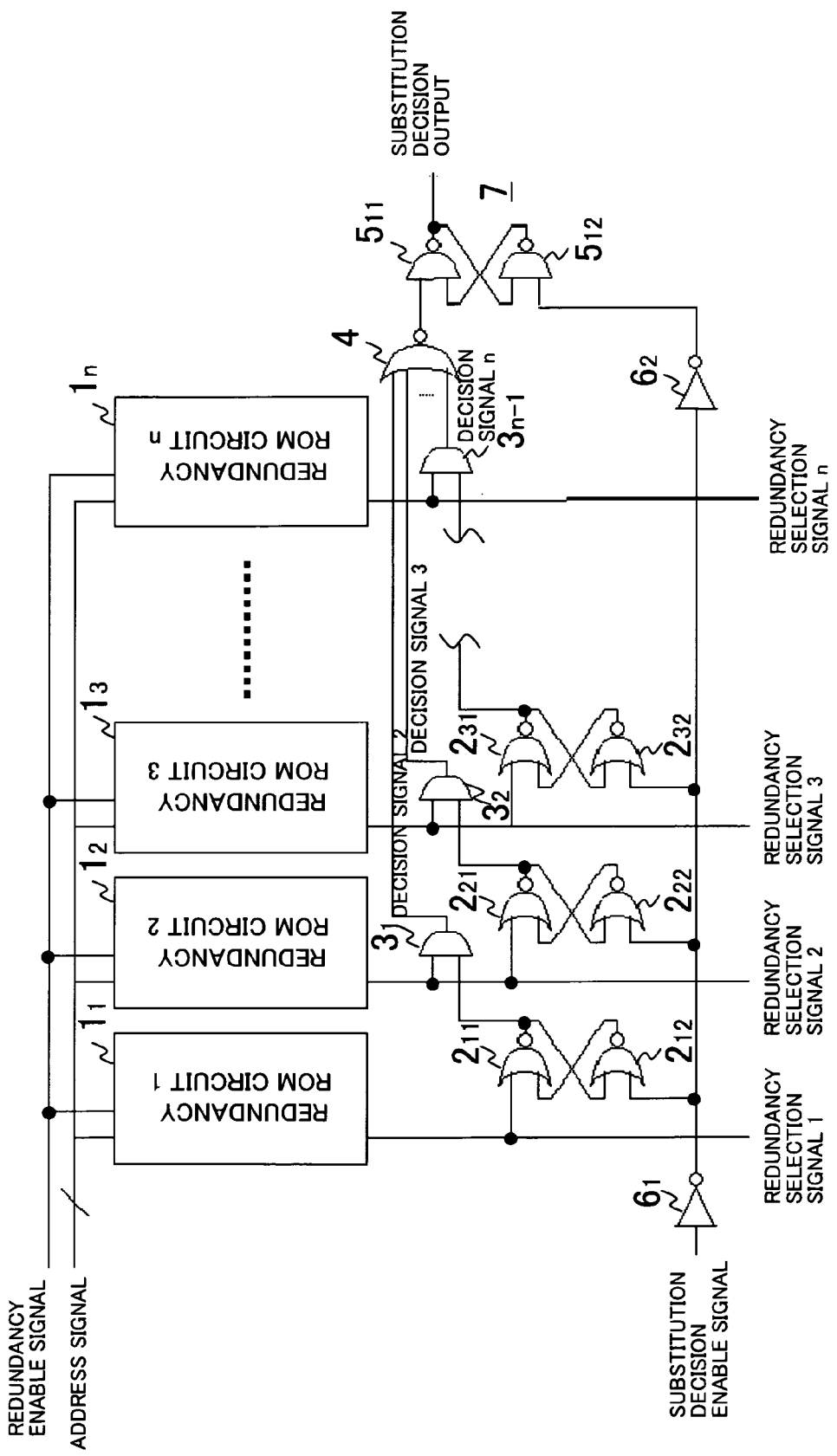
FIG. 1 is a schematic circuit diagram showing a configuration of a first example of the present invention.

A redundancy circuit in a mode of the present invention, shown in FIG. 1, includes a plural number (n) of redundancy ROM circuits $1_1$ to $1_n$, for repairing plural row and column addresses in a memory array in a semiconductor memory device. For example, in a redundancy ROM circuit, a repair address information, that is, an address replaced by a redundant address, is programmed (recorded). If, during use of the memory, a redundancy enable signal is activated by an external command, and an input address (row or column address) coincides with the address information programmed in the redundancy ROM circuit (hit), the redundancy ROM circuit sets the redundancy selection signal to HIGH and the redundant address corresponding to the redundancy ROM circuit with the redundancy selection signal set to HIGH is selected. If the row address, as an object of repair, is programmed in the redundancy ROM circuit, a redundancy word line, associated with the redundancy selection signal, is activated in case of hit. If the column address, as an object of repair, is programmed in the redundancy ROM circuit, the column switch, associated with the redundancy selection signal, is turned on in case of hit.

If a plural number of addresses are programmed in the same plural number of the redundancy ROM circuits, repair addresses are programmed in the first to n-th redundancy ROM circuits $1_1$ to $1_n$, in a preset address order. In the present example, the repair addresses are set in an ascending order, that is, in an order of the first, second, . . . , and so on, up to the n-th redundancy ROM circuit. Thus, if the repair address, programmed in an i-th redundancy ROM circuit $1_i$ is $A_i$, and the repair address, programmed in an (i+1)th redundancy ROM circuit $1_{i+1}$ is $A_{i+1}$, $A_i < A_{i+1}$.

If, in the present invention, a substitution check test is to be carried out, entry is made to the test mode, and the substitution decision enable signal is set to HIGH. The substitution decision enable signal is controlled by a control circuit and a command decoder, not shown, in the semiconductor memory device. An address is then entered from outside, such as from an automated test equipment. If the repair addresses are set in a redeemed order, such as in an ascending order, in each of the redundancy ROM circuits, the redundancy selection signal in the activated state, such as in a HIGH level, is output in the ascending order, or in the order of the first redundancy ROM circuit $1_1$, second first redundancy ROM circuit $1_2$ . . . , and so forth. If j redundancy ROM circuits, where j<=n, are used, a HIGH level redundancy selection signal j is finally output from the j-th redundancy ROM circuit $1_j$. If all of n redundancy ROM circuits are used, a HIGH level redundancy selection signal n is finally output from the n-th redundancy ROM circuit $1_n$.

If, in the redundancy circuit, shown in FIG. 1, the redundancy selection signals sequentially become HIGH in the order of the first redundancy ROM circuit $1_1$, second first redundancy ROM circuit $1_2$ . . . , and so on, up to the j-th redundancy ROM circuit $1_j$, where j<=n, the substitution decision output is kept in an inactivated state (LOW level). Although there is imposed no limitation on the present invention, the substitution decision output is LOW in case substitution is in the correct ascending order. In case of a reverse order, the substitution decision output becomes HIGH. When the substitution decision output is in the inactivated state, it is determined at any rate that there has been made no programming error (no error in fuse blowing by laser cutting).

If repair addresses are not programmed in the plural redundancy ROM circuits in the predetermined order, the order of the HIGH redundancy selection signals being correctly output in the sequence of the first redundancy ROM circuit $1_1$, second first redundancy ROM circuit $1_2$ . . . , and so on, up to the j-th redundancy ROM circuit $1_j$, and so on, where j<=n, is upset. For example, if a HIGH redundancy selection signal has been output from the (i+1)th redundancy ROM circuit $1_{i+1}$, when as yet the HIGH redundancy selection signal has not been output from the i-th redundancy ROM circuit $1_i$, the number of which is less by 1 than that of the (i+1)th redundancy ROM circuit $1_{i+1}$, this state is detected to activate the decision signal. At this time point, the substitution decision output is set to and kept at the activated state (HIGH). In this case, the occurrence of the reverse order has been detected in the addresses programmed in the redundancy ROM circuit, so that a decision is given that a programming error has occurred.

By externally reading the substitution decision output from outside of the semiconductor memory device, it may be known whether or not repair addresses are correctly programmed in a desired manner in the redundancy ROM circuit in the semiconductor memory device. In the present example, the substitution decision output is not HIGH for all of cases where repair addresses have failed to be programmed in the desired sequence. However, from the viewpoint of the probability of occurrence of address programming errors in laser cutting of fuses, for example, the function of detection of the reverse order according to the present invention is practically effective for evaluating the temporal changes in the substitution rate or machine (laser cut machine) dependence of semiconductor memory products. The present invention will now be described with reference to preferred examples of the invention.

FIG. 1 shows the configuration of an example of the present invention. Referring to FIG. 1, a redundancy circuit of the present example includes first to n-th redundancy ROM circuits $1_1$ to $1_n$, where n is a preset integer not less than 2. Address signals and a redundancy enable signal are supplied common to the first to n-th redundancy ROM circuits. Each redundancy ROM circuit includes a number of fuses, not shown, corresponding to the number of bits of an address to be programmed. Moreover, each redundancy ROM circuit includes a circuit, not shown, for deciding, in case the redundancy enabling signal is activated, whether or not the input address signal coincides bit-by-bit with the programmed address information, that is, hit or miss. The result of the decision is output as a redundancy decision signal. In the present example, when the redundancy enabling signal is a HIGH level, and the input address signal coincides with the programmed address information, that is, in case of a hit, the redundancy decision signal is set to HIGH.

A redundancy selection signal 1 from the first redundancy ROM circuit $1_1$ is supplied to a reset terminal of a first SR flip-flop, also called an SR latch, composed of a two-input NOR circuit $2_{11}$ and a two-input NOR circuit $2_{12}$. This reset terminal is one input terminal of the NOR circuit $2_{11}$. A substitution enabling signal which is for controlling the substitution decision test mode, is inverted by an inverter $6_1$ and supplied to a set terminal of the first SR flip-flop, which is one input terminal of the NOR circuit $2_{12}$. An output terminal of the NOR circuit $2_{11}$ is connected to the other input terminal of the NOR circuit $2_{12}$, an output terminal of which is connected to the other input terminal of the NOR circuit $2_{11}$.

When the set terminal of the first SR flip-flop (one input terminal of the two-input NOR circuit $2_{12}$) is HIGH, with the substitution decision enable signal being LOW, and the reset terminal of the first SR flip-flop (one input terminal of the two-input NOR circuit $2_{11}$) is LOW, with the redundancy selection signal being LOW, an output of the first SR flip-flop (output of the NOR circuit $2_{11}$) becomes HIGH.

When the reset terminal of the first SR flip-flop (one input terminal of the two-input NOR circuit $2_{11}$) is HIGH, with the redundancy selection signal 1 being HIGH, and the set terminal of the first SR flip-flop (one input terminal of the two-input NOR circuit $2_{12}$) is LOW, with the substitution decision enable signal being HIGH, an output of the first SR flip-flop (output of the NOR circuit $2_{11}$) becomes LOW.

When the set terminal and the reset terminal of the first SR flip-flop are both LOW, an output of the first SR flip-flop keeps its current value. The condition of both the set and reset terminals of the first SR flip-flop being HIGH is inhibited.

A redundancy selection signal 2 from the second redundancy ROM circuit $1_2$ is supplied to a reset terminal of a second SR flip-flop, composed of a two-input NOR circuit $2_{21}$ and a two-input NOR circuit $2_{22}$. A signal obtained by inverting the substitution decision enable signal by the inverter $6_1$ is supplied to a set terminal of the second SR flip-flop (one input terminal of the two-input NOR circuit $2_{22}$). An output terminal of the NOR circuit $2_{21}$ is connected to the other input terminal of the NOR circuit $2_{22}$. An output terminal of the NOR circuit $2_{22}$ is connected to the other input terminal of the NOR circuit $2_{21}$.

An output of the first SR flip-flop (output of the NOR circuit $2_{11}$) and a redundancy selection signal 2 from the second redundancy ROM circuit are supplied to a two-input AND circuit $3_1$, an output signal of which is output as a decision signal 2.

When the set terminal of the second SR flip-flop (one input terminal of the two-input NOR circuit $2_{22}$) is HIGH, with the substitution decision enable signal being LOW, and the reset terminal (one input terminal of the two-input NOR circuit $2_{21}$) is LOW, with the redundancy selection signal 2 being LOW, an output of the second SR flip-flop (output of the NOR circuit $2_{21}$) becomes HIGH.

When the reset terminal of the second SR flip-flop (one input terminal of the two-input NOR circuit $2_{21}$) is HIGH, with the redundancy selection signal 2 being HIGH, and its set terminal (one input terminal of the two-input NOR circuit $2_{22}$) is LOW, with the substitution decision enable signal being HIGH, the output of the second SR flip-flop (output of the NOR circuit $2_{21}$) is reset to a LOW level. When the set and reset terminals of the second SR flip-flop circuit are both LOW, the output of the second SR flip-flop keeps its previous state. The condition of both the set and reset terminals of the second SR flip-flop being HIGH is inhibited.

A redundancy selection signal 3 from the third redundancy ROM circuit is supplied to a reset terminal of a third SR flip-flop composed of a two-input NOR circuit $2_{31}$, and a two-input NOR circuit $2_{32}$ (one input terminal of the two-input NOR circuit $2_{31}$). A signal inverted from the substitution decision enable signal by the inverter $6_1$ is supplied to the set terminal of the third SR flip-flop (one input terminal of the two-input NOR circuit $2_{32}$). An output terminal of the NOR circuit $2_{31}$ is connected to the other input terminal of the NOR circuit $2_{32}$, and an output terminal of the NOR circuit $2_{31}$ is connected to the other input terminal of the NOR circuit $2_{31}$.

An output of the second SR flip-flop (output of the NOR circuit $2_{21}$) and the redundancy selection signal 2 from the third redundancy ROM circuit are supplied to a two-input AND circuit $3_2$, an output signal of which is output as a decision signal 3.

When the set terminal of the third SR flip-flop (one input terminal of the two-input NOR circuit $2_{32}$) is HIGH, with the substitution decision enable signal being LOW, and its reset terminal (one input terminal of the two-input NOR circuit $2_{31}$) is low, with the redundancy selection signal 3 being LOW, an output of the second SR flip-flop (output of the NOR circuit $2_{31}$) becomes HIGH.

When the reset terminal of the second SR flip-flop (one input terminal of the two-input NOR circuit $2_{31}$) is HIGH, with the redundancy selection signal 3 being HIGH, and its set terminal (one input terminal of the two-input NOR circuit $2_{32}$) is LOW, with the substitution decision enable signal being HIGH, the output of the third SR flip-flop (output of the NOR circuit $2_{31}$) is reset to a LOW level. When the set and reset terminals of the third SR flip-flop are both Low, the output of the third SR flip-flop keeps its previous state. The condition of both the set and reset terminals of the third flip-flop being HIGH is inhibited. The SR flip-flops, provided in association with the other redundancy ROM circuits, not shown, are of similar constitution.

In similar manner, an output of the SR flip-flop, associated with the (n−1)th redundancy ROM circuit, not shown, and a redundancy selection signal n from the n-th redundancy ROM circuit $1_n$, are supplied to a two-input AND circuit $3_{n-1}$, an output of which is output as a decision signal n.

The decision signals 2 to n, output from the AND circuits $3_1$ to $3_{n-1}$, respectively, are supplied to an (n−1)-input NOR circuit 4. An output of the (n−1)-input NOR circuit 4 is supplied to a set terminal of an SR flip-flop 7 composed of two-input NAND circuits $5_{11}$, $5_{12}$ (one input terminal of the NAND circuit $5_{11}$). A substitution decision enable signal (the inverted signal of the substitution decision enable signal re-inverted by an inverter $6_2$) is supplied to a reset terminal of the flip-flop 7 (an input terminal of the NAND circuit $5_{12}$).

When a LOW level is applied to a reset terminal of the SR flip-flop 7 (one input terminal of the NAND circuit $5_{12}$) and a HIGH level is applied to the set terminal of the SR flip-flop 7 (one input terminal of the NAND circuit $5_{11}$), with the output of the NOR circuit 4 being HIGH, the substitution decision output, as an output of the SR flip-flop 7 (output of the NAND circuit $5_{11}$), is reset to a LOW level.

When a LOW level is applied to the set terminal of the RS flip-flop 7 (one input terminal of the NAND circuit $5_{11}$), and a HIGH level is applied to the reset terminal of the SR flip-flop 7 (one input terminal of the NAND circuit $5_{12}$), a substitution decision signal, as an output signal of the SR flip-flop 7 (output of the NAND circuit $5_{11}$), is set to a HIGH level. When a HIGH level is applied to both the set and reset terminals of the SR flip-flop 7, the output keeps its previous state. The condition of both the set terminal and the reset terminal of the SR flip-flop 7 being LOW is inhibited.

If, in the circuit of FIG. 1, the substitution decision enable signal before the substitution decision test, is LOW, the outputs of the first to (n−1)th SR flip-flops, associated with the first to (n−1)th redundancy ROM circuits $1_1$ to $1_n$, respectively, are set to a HIGH level.

Since the redundancy selection signals 1 to n from the first to (n−1)th redundancy ROM circuits $1_1$ to $1_n$ are LOW, the outputs of the AND circuits $3_1$ to $3_{n-1}$ are all LOW. Hence, the output of the NOR circuit 4 is HIGH and the substitution decision output is set to LOW.

If, in the substitution test mode, the substitution decision enable signal is set from LOW to HIGH, addresses are sequentially input from outside in an ascending order, and the output of the NOR circuit 4 is HIGH, that is, if the redundancy selection signals are activated in an ascending order, the substitution decision output remains LOW.

If, between the redundancy selection signals 1 and n, the redundancy selection signal i+1 becomes HIGH before the redundancy selection signal i, responsive to the input address information and the redundancy enable signal, the output of the SR flip-flop, associated with the i-th redundancy ROM circuit $1_i$, remains set to a HIGH level. That is, the redundancy enable signal i, supplied to the reset terminal of the SR flip-flop, associated with the i-th redundancy ROM circuit $1_i$, is LOW at this time point, so that the output of the SR flip-flop, associated with the i-th redundancy ROM circuit $1_i$ keeps its previous state. An output of the AND circuit $3_i$ associated with the (i+1)th redundancy ROM circuit $1_{i+1}$ goes HIGH, responsive to the HIGH-level redundancy selection signal i+1 and the HIGH-level output of the SR flip-flop of the previous stage. At this time point, the output of the NOR circuit 4 goes from HIGH to LOW to set the output of the SR flip-flop 7 (substitution decision output) to HIGH responsive to this transition. A specified operational example is now described.

Figure 2:
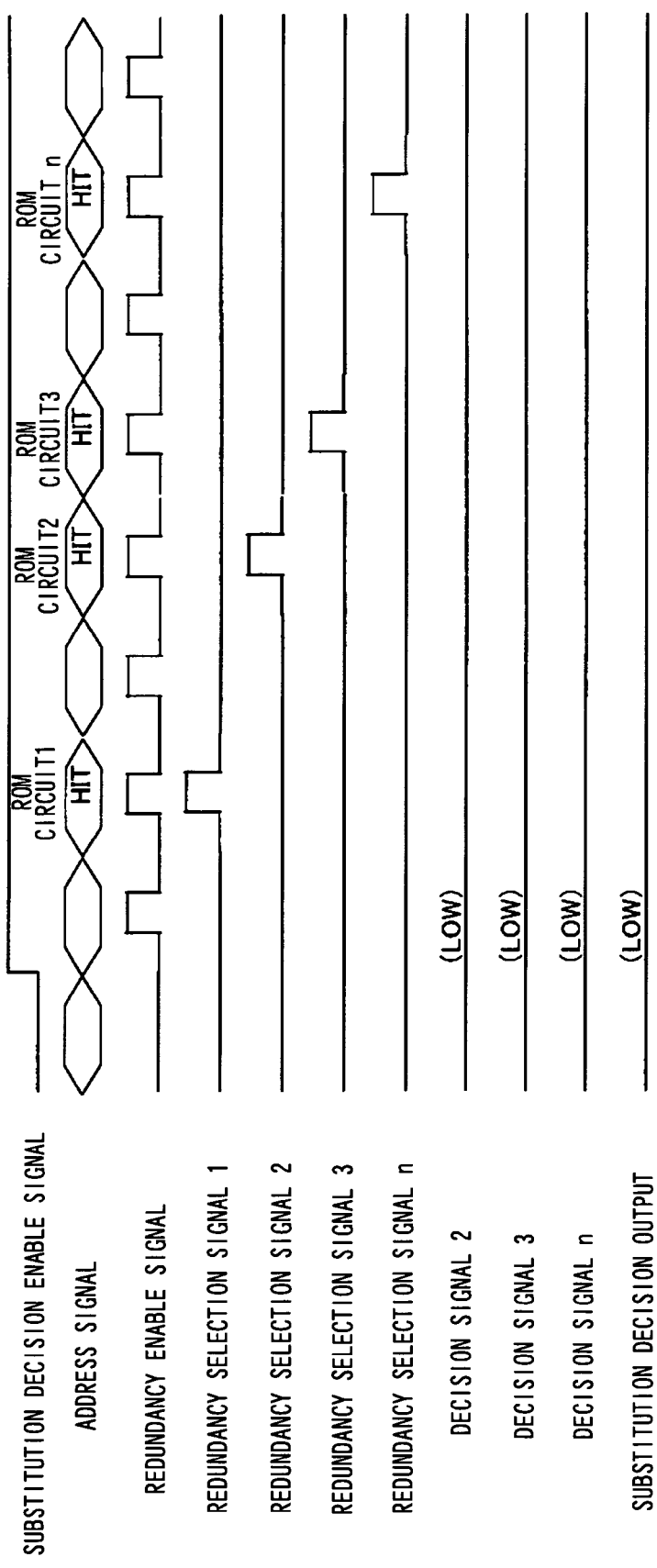
FIG. 2 is a timing diagram showing an example of the operation of the first example of the present invention.

FIG. 2 is a timing diagram showing an example of the normal operation of the circuit of FIG. 1, specifically, the operation when the order of programming of the repair addresses is the normal order from the first redundancy ROM circuit $1_1$ up to n-th redundancy ROM circuit $1_n$. That is, the largeness/smallness relationships of the values of addresses A1, A2, . . . , and An, programmed in the first to n-th redundancy ROM circuits $1_1$, $1_2$, . . . , and $1_n$, respectively, are in the ascending order, that is, A1<A2< . . . <An.

When the substitution decision enable signal is LOW, an output of the inverter $6_1$ becomes HIGH. An output of the first SR flip-flop, associated with the first redundancy ROM circuit $1_1$ (output of the NOR circuit $2_{11}$) becomes HIGH. An output of the second SR flip-flop, associated with the second redundancy ROM circuit $1_2$ (output of the NOR circuit $2_{21}$) also becomes HIGH and so forth so that the output of the (n−1)th SR flip-flop associated with the (n−1)th redundancy ROM circuit $1_{n-1}$ also becomes HIGH. When the substitution decision enable signal is LOW, the output of the SR flip-flop 7 is reset to LOW.

When the substitution decision enable signal becomes HIGH, an output of the inverter $6_1$ becomes LOW. An output of the first SR flip-flop, associated with the first redundancy ROM circuit 11 (output of the NOR circuit $2_{11}$), remains HIGH. The outputs of the second to (n−1)th SR flip-flops, associated with the second to (n−1)th redundancy ROM circuits, respectively, also remain HIGH.

If the substitution decision enable signal is HIGH, and the redundancy selection signals 1 to n are LOW, the outputs of the AND circuits $3_1$ to $3_{n-1}$ are LOW and hence the output of the (n−1)-input NOR circuit 4 is HIGH, so that the output of the SR flip-flop 7 (output of the NAND circuit $5_{11}$) is kept LOW.

If, with the redundancy enable signal (pulse signal) being HIGH, an input address signal coincides with an address programmed in the first redundancy ROM circuits $1_1$ (ROM circuit 1) (see 'OM circuit 1 HIT' of the address signal in FIG. 2), the redundancy selection signal 1 becomes HIGH, and an output of the first SR flip-flop (output of the NOR circuit $2_{11}$) is reset to LOW. If conversely the redundancy selection signal 1 is LOW, the output of the first flip-flop (output of the NOR circuit $2_{11}$) remains HIGH.

If the redundancy enable signal (pulse signal) is HIGH and the input address signal coincides with the address programmed in the second redundancy ROM circuits $1_2$ (ROM circuit 2) (see 'ROM circuit 2 HIT' of the address signal of FIG. 2), the redundancy selection signal 2 becomes HIGH. Since the output of the first SR flip-flop (output of the NOR circuit $2_{11}$) is LOW, the decision signal 2, output from the AND circuit $3_1$, is LOW, and hence the output of the (n−1)-input NOR circuit 4 remains HIGH.

In the example of FIG. 2, if the redundancy enable signal (pulse signal) is HIGH and the input address signal coincides with the address programmed in the n-th redundancy ROM circuit $1_n$ (ROM circuit n) (see 'ROM circuit n HIT' of the address signal of FIG. 2), the redundancy selection signal n becomes HIGH. Since the redundancy selection signal n−1 has already become HIGH and the output of the (n−1)th SR flip-flop is LOW, the decision signal n, output from the AND circuit $3_n$, is LOW, so that the decision signal n, output from the (n−1)-input NOR circuit 4, remains HIGH. Meanwhile, in the timing diagram of FIG. 2, the HIGH period of the redundancy enable signal (pulse) and the HIGH period of the redundancy selection signal of the redundancy ROM circuit that has hit are shown by temporally coincident waveforms. The present invention is not limited to this case since it is only sufficient that the pulse (one-shot pulse) of the redundancy selection signal is comprised within one cycle of the redundancy enable signal. The same applies for other timing diagrams as well.

Figure 3:
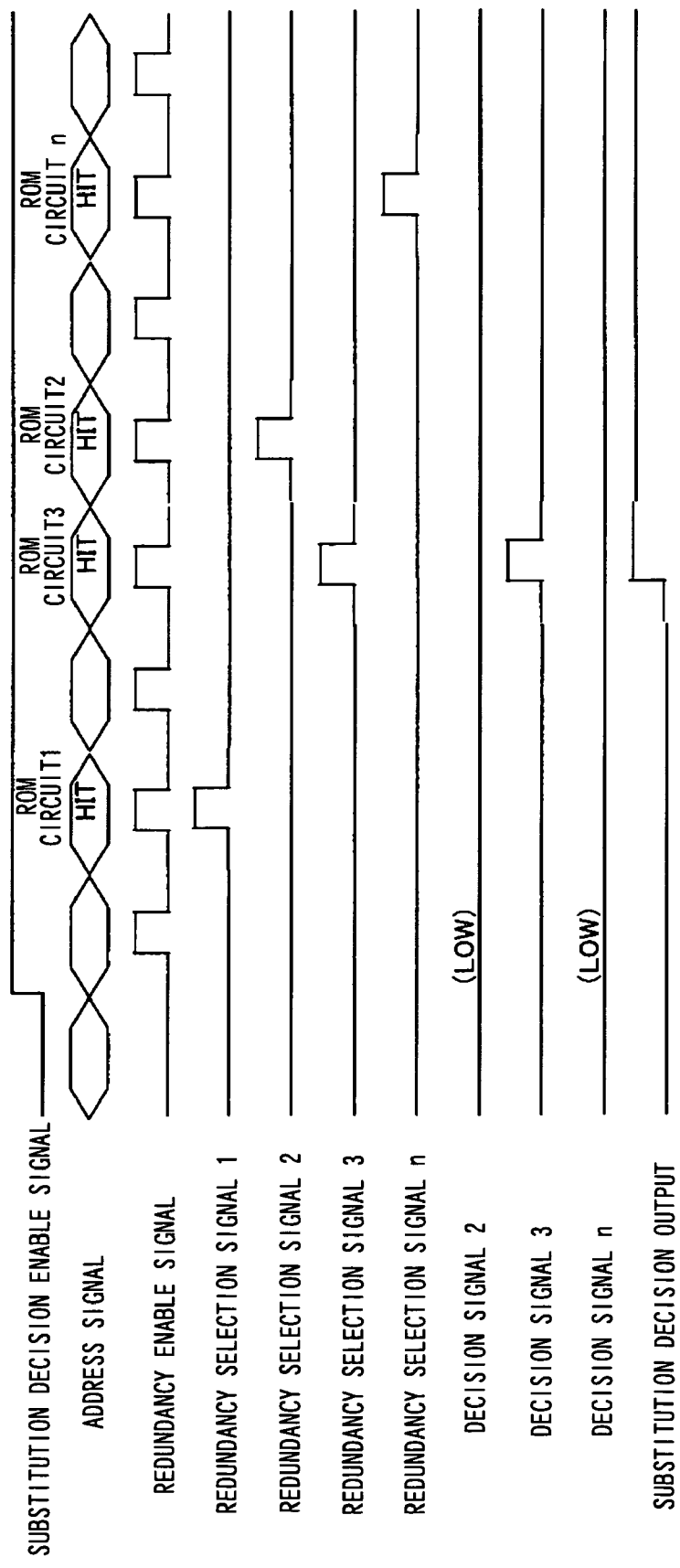
FIG. 3 is a timing diagram showing another example of the operation of the first example of the present invention.

FIG. 3 shows an operational example in case of sequence reversal, in which the sequence of the repair addresses has been upset between the second redundancy ROM circuit $1_2$ and the third redundancy ROM circuit $1_3$ in the circuit of FIG. 1. That is, the largeness/smallness relationship of the values of addresses A2 and A3, programmed in the second redundancy ROM circuit $1_2$ and the third redundancy ROM circuit $1_3$, has become A2>A3, instead of the correct largeness/smallness relationship of A2<A3, due to a laser cutting error, for example.

If the substitution decision enable signal is LOW, an output of the SR flip-flop 7 is reset to LOW, as in FIG. 2. If, with the HIGH substitution decision enable signal, the redundancy selection signals 1 to n are LOW, the decision signals 1 to n are LOW, the decision signals 2 to n of the AND circuit $3_1$ to the AND circuit $3_{n-1}$ are all LOW, so that the output of the (n−1)-input NOR circuit 4 is HIGH, and hence the output of the SR flip-flop 7 is LOW.

If, with the HIGH redundancy enable signal (pulse signal), the input address signal coincides with the address information programmed in the first redundancy ROM circuit $1_1$ (ROM circuit 1), as in 'ROM circuit 1 HIT' of the address signal of FIG. 3, the redundancy selection signal 1 becomes HIGH, and hence the output of the first SR flip-flop (output of the NOR circuit $2_{11}$) is reset to LOW. If conversely the redundancy selection signal 1 is LOW, the output of the first SR flip-flop (output of the NOR circuit $2_{11}$) remains HIGH.

If, with the HIGH redundancy enable signal (pulse signal), the input address signal coincides with the address programmed in the third redundancy ROM circuit $1_3$ (ROM circuit 3), as in 'ROM circuit 3 HIT' of FIG. 3, the redundancy selection signal 3 becomes HIGH. Since the output of the second SR flip-flop associated with the second redundancy ROM circuit $1_2$ (ROM circuit 2), that is, the output of the NOR circuit $2_{21}$, is HIGH, the decision signal 3, output from the AND circuit $3_2$, is HIGH. The decision signal 3 is HIGH during the HIGH period of the redundancy enable signal. Thus, the output of the (n−1)-input NOR circuit 4 becomes LOW to set the substitution decision output of the SR flip-flop 7 to HIGH.

If, with the HIGH redundancy enable signal (pulse signal), the input address signal coincides with the address programmed in the second redundancy ROM circuit $1_2$ (ROM circuit 2), as in 'ROM circuit 2 HIT' of the address signal of FIG. 3, the redundancy selection signal 2 becomes HIGH. Since the output of the first SR flip-flop, associated with the first redundancy ROM circuit $1_1$ of the previous stage (ROM circuit 1), that is, the output of the NOR circuit $2_{11}$, is LOW, the decision signal 2, output from the AND circuit $3_1$, is LOW. The output of the second SR flip-flop, that is, the output of the NOR circuit $2_{21}$, becomes LOW responsive to the HIGH redundancy selection signal 2 from the second redundancy ROM circuits $1_2$ (ROM circuit 2). The decision signal 3, output from the AND circuit $3_3$, is LOW. Since the decision signals 1 to n, supplied to the (n−1)-input NOR circuit 4, are all LOW, the output of the (n−1)-input NOR circuit 4 is HIGH. Since the substitution decision enable signal is HIGH, the substitution decision output of the SR flip-flop 7 is kept HIGH. That is, the redundancy enable signal (pulse signal) is HIGH and the input address signal coincides with the address programmed in the n-th redundancy ROM circuit $1_n$ (ROM circuit n), as in 'ROM circuit n HIT' of the address signal of FIG. 3. The redundancy selection signal n becomes HIGH. The SR flip-flop 7 keeps the HIGH of the substitution decision output until the substitution decision enable signal is set to LOW.

Thus, the redundancy selection signal 3 of the third redundancy ROM circuit $1_3$ becomes HIGH in the course of scanning the addresses input to the first to n-th redundancy ROM circuits $1_1$ to $1_n$ in the ascending order, before the redundancy selection signal 2 of the second redundancy ROM circuit $1_2$ becomes HIGH. At this time point, the substitution decision output is changed from LOW to HIGH and kept HIGH until the SR flip-flop 7 is reset. Meanwhile, the SR flip-flop 7 is reset by the LOW of the redundancy decision enable signal.

In the present example, it is checked whether or not the largeness/smallness relationship of the values of the repair addresses is kept in the normal order from the first to the n-th redundancy ROM circuits $1_1$ to $1_n$. However, if a repair address $A_i$, which is to be programmed in the i-th redundancy ROM circuit $1_i$, is actually programmed as $A_i'$, where $A_i<A_i'$ or $A_i'<A_i$, and $A_i'$ is such that $A_i'<=A_{i+1}$, where $A_{i+1}$ is a repair address programmed in the neighboring (i+1)th redundancy ROM circuit $1_{i+1}$, programming errors cannot be detected. Moreover, if $A_i'$ is such that $A_{i-1}<=A_i'<=A_i$, where $A_{i-1}$ is a repair address programmed in an (i−1)th redundancy ROM circuit $1_{i-1}$, no programming errors can be detected. In case of a programming error of the LSB (least significant bit) of a repair address, there occurs no reverse order due to address programming error. If the i-th redundancy ROM circuit $1_i$ and the i+1'th redundancy ROM circuit $1_{i+1}$ are both in error and addresses $A_i'$ and $A_{i+1}'$, are programmed, respectively, and $A_i'<A_{i+1}'$ in this case, no reverse order is produced, so that no programming error can be detected. Moreover, if the repair address $A_1$, which should inherently be programmed in the first redundancy ROM circuit $1_1$, is actually programmed to $A_1'$, where $A_1'<A_i$, as may occur due to blowing off a fuse before the fuse in register with an address bit, no reverse order is produced, so that no programming error can be detected. Likewise, if the repair address $A_n$, which should be programmed in the n-th redundancy ROM circuit $1_n$, is actually programmed to $A_n'$, where $A_n<A_n'$, as may occur due to blowing off a fuse before a fuse in register with an address bit, no reverse order is produced, so that no programming error can be detected. Laser cutting errors are correlated with problems on the laser equipments, such as excess or insufficient laser power, spot diameter or positioning accuracy, material characteristics of the fuse circuit in the semiconductor device, such as melting points, fuse circuit structures, such as an insulating film on a fuse, or a dimension of a fuse circuit. The probability of the occurrence of errors in laser cutting of fuses is relatively low. The case where a fuse to be blown has not been blown ($A_i'<A_i$) occurs only in the first redundancy ROM circuit 11 at the terminal end and the blowing of a fuse before the fuse to be blown ($A_n<A_n'$) occurs only in the n-th redundancy ROM circuit In would occur more rarely. Thus, the present invention is practically effective for evaluating the temporal changes of the substitution rate or machine dependence of products, despite a simplified circuit configuration where it is unnecessary to read out addresses programmed in the redundancy ROM circuits.

Figure 4:
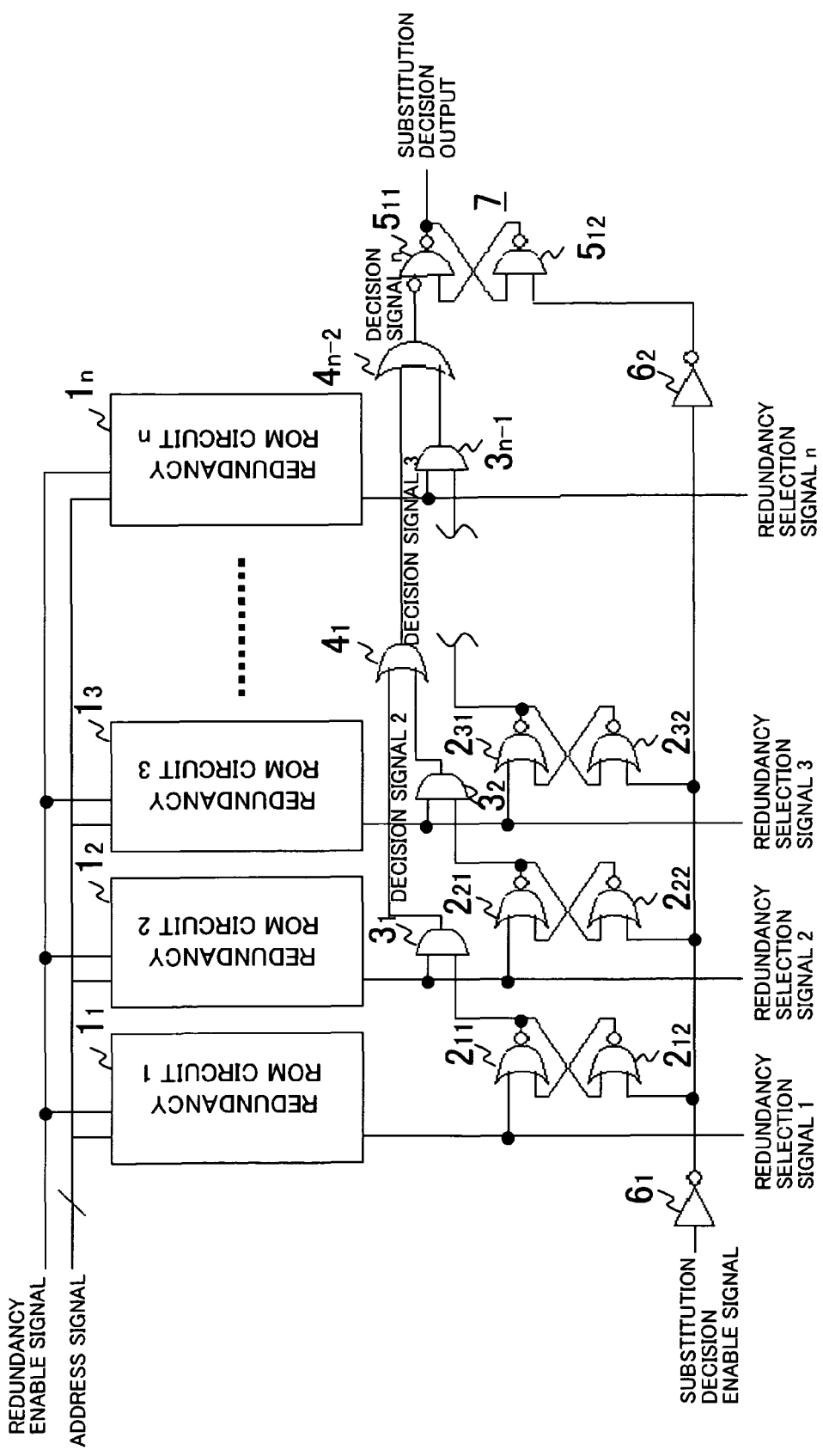
FIG. 4 is a schematic circuit diagram showing a configuration of a second example of the present invention.

FIG. 4 shows the configuration of a second example of the present invention. Referring to FIG. 4, the (n−1)-input NOR circuit 4 of FIG. 1 is constituted in the present example by (n−2) cascaded two-input OR circuits $4_1$ to $4_{n-2}$. For the set input to the SR flip-flop 7, an inverted logic of the decision signal n, output from the last stage two-input OR circuit $4_{n-2}$, is used. If, with the HIGH substitution decision enable signal and with a LOW output state of the SR flip-flop 7, the decision signal n, output from the two-input OR circuit $4_{n-2}$, becomes HIGH, the output of the SR flip-flop 7 is set. An output (HIGH) of the stage of the two-input OR circuit of the (n−2) cascaded two-input OR circuits $4_1$ to $4_{n-2}$, which has been the first to become HIGH, directly becomes the decision signal n, as an output of the last stage two-input OR circuit $4_{n-2}$, to set and latch the SR flip-flop 7.

More specifically, each two-input OR circuit takes a logical OR of an output of the AND circuit of the redundancy ROM circuit, located in a directly previous stage of the redundancy ROM circuit, associated with the OR circuit of interest, and an output of the AND circuit associated with the redundancy ROM circuit, and outputs the resulting logical OR to the next stage two-input OR circuit. The last-stage two-input OR circuit $4_{n-2}$, associated with the n-th redundancy ROM circuit $1_n$, takes a logical OR of the decision signal from the previous stage OR circuit and an output of an AND circuit $3_{n-1}$ associated with the n-th redundancy ROM circuit $1_n$, and outputs the result of the logical AND as a decision signal n to the set terminal of the SR flip-flop 7. The cascaded two-input OR circuits are substantially the same as the (n−1)-input NOR circuit 4 shown in FIG. 1. The configuration of FIG. 5 is otherwise the same as that of FIG. 1.

Figure 5:
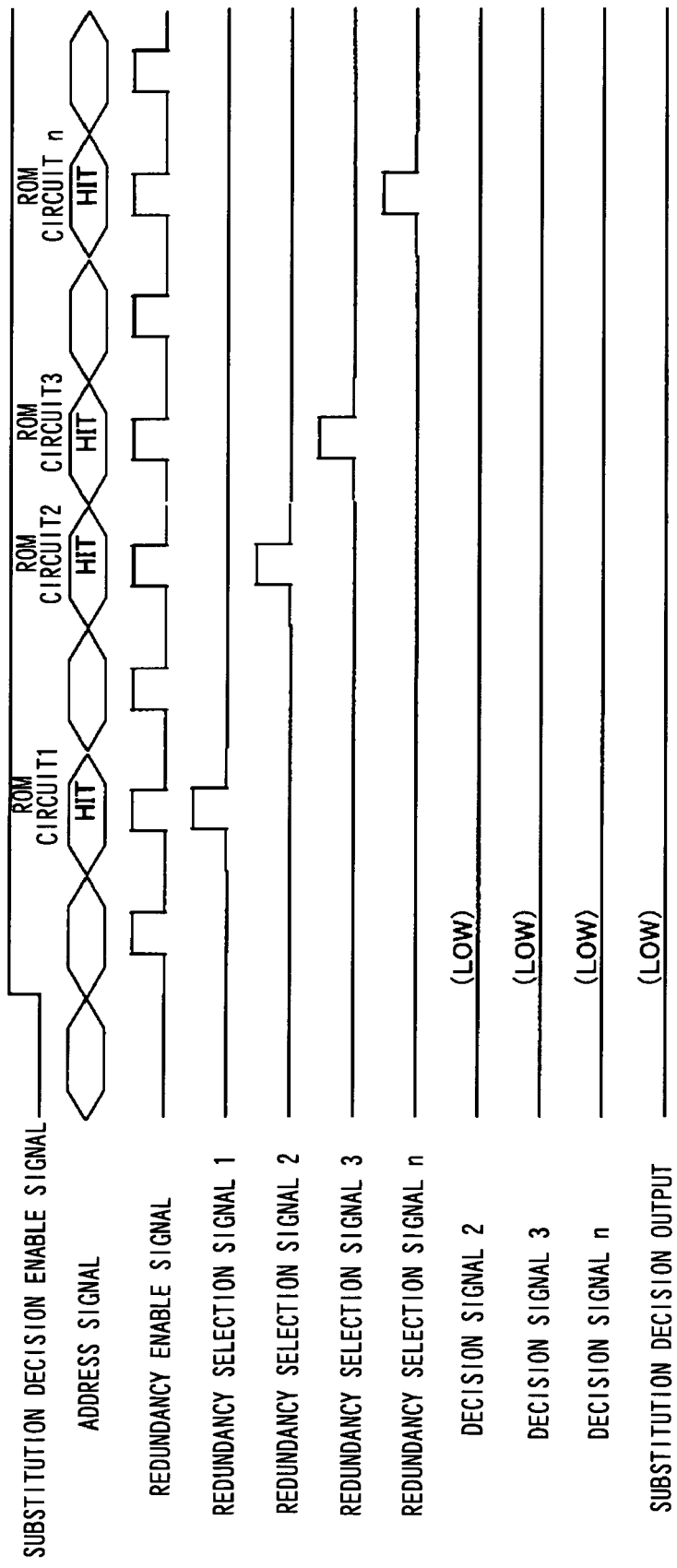
FIG. 5 is a timing diagram showing an example of the operation of the second example of the present invention.

FIG. 5 depicts a timing diagram showing an example of the normal operation of the circuit of FIG. 4, that is, an example in which the repair address programming sequence is the ascending order (normal order). The decision signals 2, 3, . . . , n of FIG. 4 in such case are all LOW. The operation is basically the same as that of FIG. 2. That is, when the substitution decision enable signal is LOW, the output of the SR flip-flop is reset to LOW. When the substitution decision enable signal is HIGH, and the redundancy selection signals 1 to n are LOW, the decision signals 2 to n, as output signals of the AND circuits $3_1$ to $3_{-1}$, are all LOW. Thus, the substitution decision output, as an output signal of the SR flip-flop 7, is LOW.

If, with the HIGH redundancy enable signal (pulse), the input address signal coincides with the address of the first redundancy ROM circuit $1_1$ (ROM circuit 1), as in 'ROM circuit 1 HIT' of the address signal of FIG. 5, the redundancy selection signal 2 of the first redundancy ROM circuit $1_1$ becomes HIGH, thus resetting the output of the second SR flip-flop, associated with the first redundancy ROM circuit $1_1$ (output of the NOR circuit $2_{11}$). The decision signal 2, as an output signal of the AND circuit $3_1$, becomes LOW independent of the value of the redundancy selection signal 2.

If, with the HIGH redundancy enable signal (pulse signal), the input address signal coincides with the address of the second redundancy ROM circuit $1_2$ (ROM circuit 2), as in 'ROM circuit 2 HIT' of the address signal of FIG. 5, the redundancy selection signal 2 of the second redundancy ROM circuit $1_2$ becomes HIGH, thus resetting the output of the second SR flip-flop (NOR circuit $2_{21}$). Thus, under this condition, when next the redundancy selection signal 3 of the third redundancy ROM circuit $1_3$ becomes HIGH, the decision signal 2, as an output signal of the AND circuit $3_2$, remains LOW, while the decision signal 3, as an output signal of the OR circuit $4_1$, also remains LOW. That is, if the addresses programmed in the first to n-th redundancy ROM circuits $1_1$ to $1_n$ are in the ascending order, the substitution decision output, as an output of the SR flip-flop 7, is kept LOW.

Figure 6:
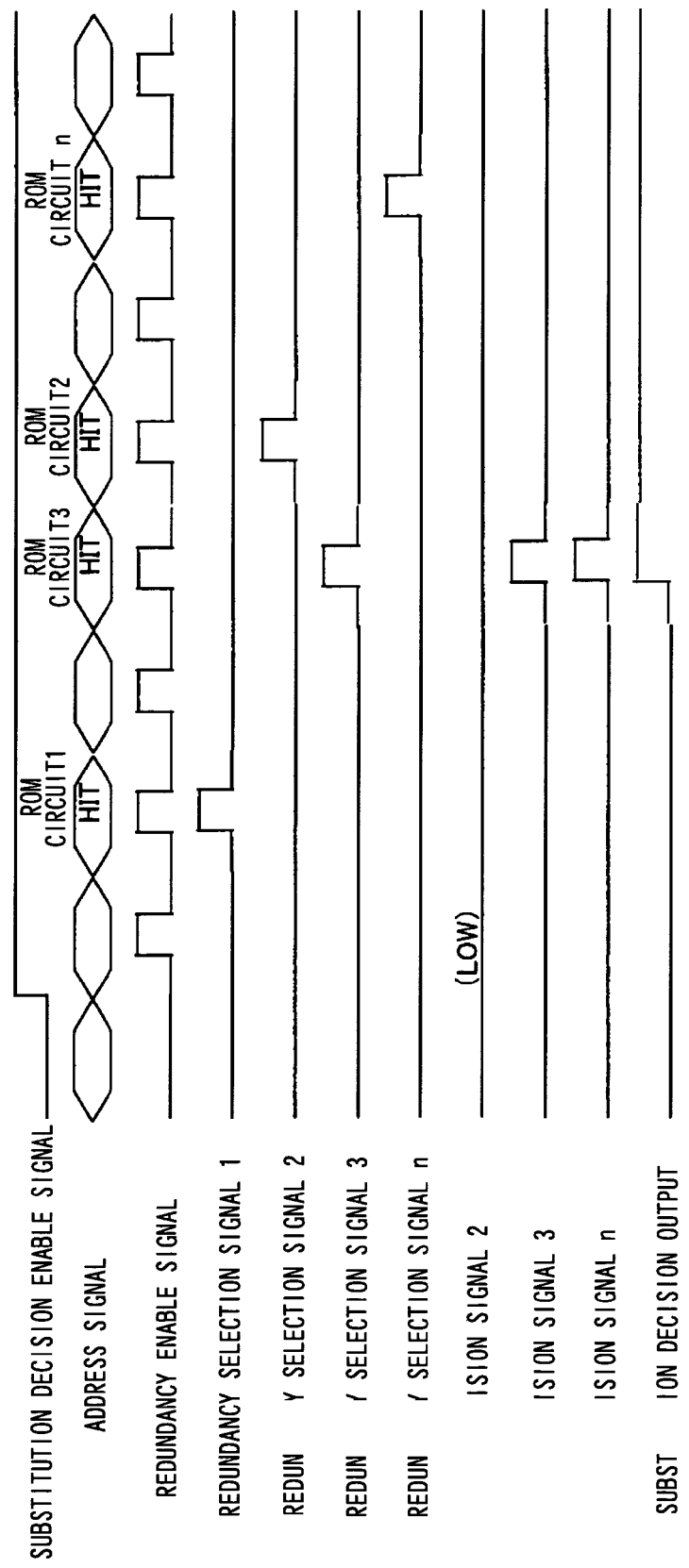
FIG. 6 is a timing diagram showing another example of the operation of the second example of the present invention.

FIG. 6 depicts an operational example in which the address value sequence in the circuit of FIG. 4 has been upset. Specifically, the largeness/smallness relationship of the values of programmed addresses is reversed between the second redundancy ROM circuit $1_2$ and the third redundancy ROM circuit $1_3$. As in FIG. 5, when the substitution decision enable signal is LOW, the output of the SR flip-flop 7 is reset to LOW. When, with the HIGH substitution decision enable signal, the redundancy selection signals 1 to n are LOW, the outputs of the AND circuits $3_1$ to $3_{n-1}$ are LOW, and the decision signals 1 to n are LOW. The output of the SR flip-flop 7 is kept LOW.

When, with the HIGH redundancy enable signal (pulse signal), the input address signal coincides with the address of the first redundancy ROM circuit $1_1$ (ROM circuit 1), as in 'ROM circuit 1 HIT' of the address signal of FIG. 6, the redundancy selection signal 1 becomes HIGH, thus resetting the output of the first SR flip-flop (output of the NOR circuit $2_{11}$) to LOW.

When, with the HIGH redundancy enable signal (pulse signal), the input address signal coincides with the address programmed in the third redundancy ROM circuit $1_3$ (ROM circuit 3), as in 'ROM circuit 3 HIT' of the address signal of FIG. 3, the redundancy selection signal 3 becomes HIGH. Since the output of the second SR flip-flop (output of the NOR circuit $2_{21}$) is HIGH at this time, that is, has not yet been reset, the decision signal, as an output signal of the AND circuit $3_2$, becomes HIGH during the HIGH period of the redundancy enable signal. The HIGH of the decision signal 3 is propagated through cascaded OR circuits, until the decision signal n, an output of the last-stage OR circuit $4_{n-2}$, becomes HIGH. It is noted hat the decision signal n becomes HIGH during the HIGH period of the redundancy enable signal. Responsive thereto, the substitution decision output, as an output signal of the SR flip-flop 7, is set to HIGH. This detects the inverted sequence of the repair addresses, that is, the sequence reversal.

Figure 7:
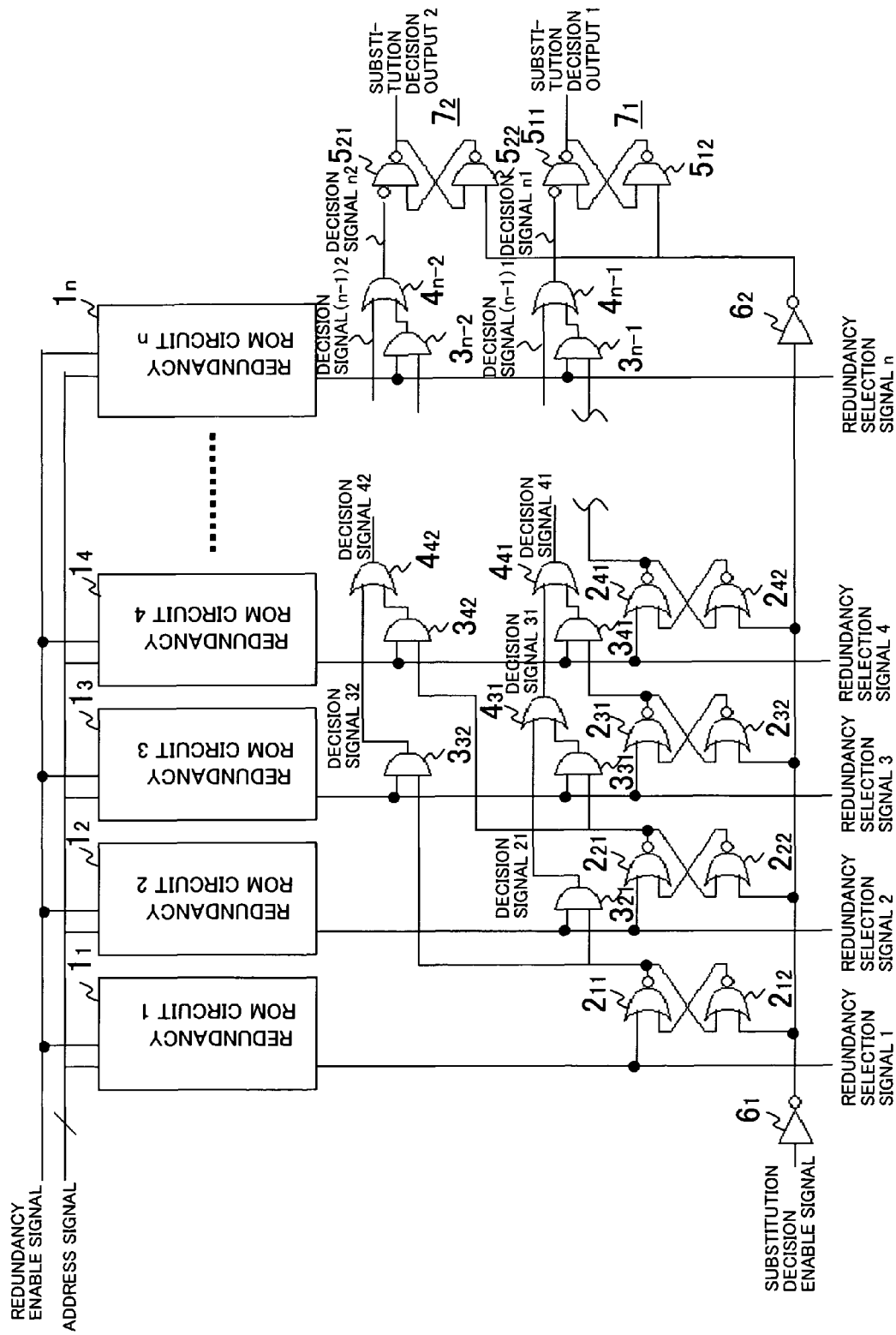
FIG. 7 is a schematic circuit diagram showing a configuration of a third example of the present invention.

FIG. 7 depicts the configuration of a third example of the present invention. The present example includes, in addition to the circuit configuration of FIG. 4, a circuit for generating a second substitution decision output 2. That is, the present example includes a circuit which, if there is a HIT in a given redundancy ROM circuit, checks not only whether there has already been a HIT in the directly previous redundancy ROM circuit, but also whether there has already been a HIT in the second previous redundancy ROM circuit. If there has been no HIT in the second previous redundancy ROM circuit, the circuit decides that the sequence is the reverse order, and outputs the result as a substitution decision output 2 of a different channel.

In FIG. 7, AND circuits $3_{21}$, $3_{31}$, an OR circuit $4_{41}$, an AND circuit $3_{n-1}$, an OR circuit $4_{n-1}$, and NAND circuits $5_{11}$, $5_{12}$, correspond to AND circuits $3_1$, $3_2$, an OR circuit $4_1$, an AND circuit $3_{n-1}$, an OR circuit $4_{n-2}$ and NAND circuits $5_{11}$ and $5_{12}$, respectively. The NAND circuits $5_{11}$ and $5_{12}$ constitute an SR flip-flop 71, corresponding to the SR flip-flop 7 of FIG. 4.

The circuit of FIG. 7 includes a two-input AND circuit $3_{32}$, a two-input AND circuit $3_{42}$ and a two-input OR circuit $4_{42}$. The two-input AND circuit $3_{32}$ receives an output of a first SR flip-flop, corresponding to the first redundancy ROM circuit $1_1$ (output of the NOR circuit $2_{11}$) and the redundancy selection signal 3 output from the third redundancy ROM circuit $1_3$. The two-input AND circuit $3_{42}$ receives an output of a second SR flip-flop, corresponding to the second redundancy ROM circuit $1_2$ (output of the NOR circuit $2_{21}$) and the redundancy selection signal 4 output from the fourth redundancy ROM circuit $1_4$. The two-input OR circuit $4_{42}$ receives a decision signal 32 output from the AND circuit $3_{32}$, and an output of the AND circuit $3_{42}$. An output of the OR circuit $4_{42}$ is to be a decision signal 42. This decision signal 42 is transferred to a two-input OR circuit, not shown, provided next to the two-input OR circuit $4_{42}$, along with the output of the third SR flip-flop corresponding to the third redundancy ROM circuit $1_3$ (output of the NOR circuit $2_{31}$) and with an output of the 2-input AND circuit, not shown, receiving the redundancy selection signal 5 output from the fifth redundancy ROM circuit $1_5$ not shown. Finally, an output of an OR circuit, associated with the (n−1)th redundancy ROM circuit $1_{n-1}$, not shown, is transferred to the two-input OR circuit $4_{n-2}$, as a decision signal (n−1)$_2$, along with the output of the SR flip-flop of the n−2th redundancy ROM circuit and an output of the two-input AND circuit $3_{n-2}$ receiving the redundancy selection signal n of the n-th redundancy ROM circuits $1_n$. Thus, the output of an OR circuit is transferred to the two-input OR circuit $4_{n-2}$. An output of the two-input OR circuit $4_{n-2}$ is transferred to the set terminal of an SR flip-flop $7_2$, composed of NAND circuits $5_{21}$, $5_{22}$ (one input terminal of the NAND circuit $5_{21}$). A substitution decision enable signal (an output of the inverter $6_2$) is transferred to the reset terminal of the SR flip-flop $7_2$ (one input terminal of the NAND circuit $5_{22}$).

It is a frequent occurrence that fuses which should not be blown in laser cutting of a fuse ROM are blown so that the order of the HIT in the redundancy ROM circuit becomes offset more backwards than the correct order. If, in a redundancy ROM circuit, a fuse of an MSB of a 10-bit address is blown through error, the programmed address is of a value 512 larger than the correct value, assuming that a fuse blown corresponds to the logic 1. Consequently, when the address is scan-input in an ascending order to the redundancy ROM circuit, HIT may occur at a hit position offset to a considerably temporally delayed position compared to the authentic address hit position.

If, in the second redundancy ROM circuit $1_2$, a fuse before the fuse to be blown is blown, and the third redundancy ROM circuit $1_3$ has hit, the redundancy selection signal 3 then being HIGH, the redundancy selection signal 2 of the second redundancy ROM circuit $1_2$ is LOW in level, and hence the output of the NOR circuit $2_2$, remains HIGH. Thus, a decision signal 31, as an output signal of an OR circuit $4_{31}$, receiving an output of an AND circuit $3_{21}$, taking a logical AND of the output of the NOR circuit $2_2$, and the redundancy selection signal 3, becomes HIGH. The decision signal 31 is propagated through cascaded OR circuits to render the decision signal n1 as an output signal of the last-stage OR circuit $4_{n-1}$ HIGH to set the substitution decision output 1 to HIGH. Since the first redundancy ROM circuit $1_1$ has already hit, its SR flip-flop has an output (output of the NOR circuit $2_{21}$) reset to LOW. The decision signal 32, as an output signal of the AND circuit $3_{32}$, is brought LOW. The decision signal n2, as an output signal of the OR circuit $4_{n-2}$, is LOW. The substitution decision output 2 is kept LOW.

If, in a fourth redundancy ROM circuit $1_4$, for instance, there is a fuse to be blown left unblown, it is a frequent occurrence that the order of the HIT of the redundancy ROM circuit is offset to a hit position offset to a temporally delayed position compared to the correct position. If, in a redundancy ROM circuit, a fuse of an MSB of a 10-bit address has not been blown through laser cutting error, the programmed address is of a value 512 smaller than the inherent correct value, assuming that a fuse blown corresponds to the logic 1. Consequently, when the address is scan-input in an ascending order to the redundancy ROM circuit, HIT may occur at a hit position offset to a position temporally earlier as compared to the inherent address hit position.

When the input address is coincident with the address programmed in the fourth redundancy ROM circuit $1_4$, the second redundancy ROM circuit $1_2$ or the third redundancy ROM circuit $1_3$ has not as yet hit. In this case, the outputs of the SR flip-flops, associated with the second redundancy ROM circuit $1_2$ and the third redundancy ROM circuit $1_3$ (outputs of the NOR circuits $2_{21}$, $2_{31}$) remain HIGH (in the set state). Hence, the decision signal 41, as an output signal of the AND circuit $3_{41}$, and the decision signal 42, as an output signal of the AND circuit $3_{42}$, are both HIGH to set both the substitution decision outputs 1 and 2 to HIGH.

In the present example, both the substitution decision outputs 1 and 2 set to HIGH indicates the likelihood that the fuse to be blown has not been blown by laser fuse cutting. The present example takes advantage of the fact that, in case a fuse before a fuse to be blown has been blown, simply the orders of two redundancy ROM circuits are interchanged, whereas, in case of non-blowing off of a fuse, which should be blown, the bit sequence may skip considerably.

Figure 8:
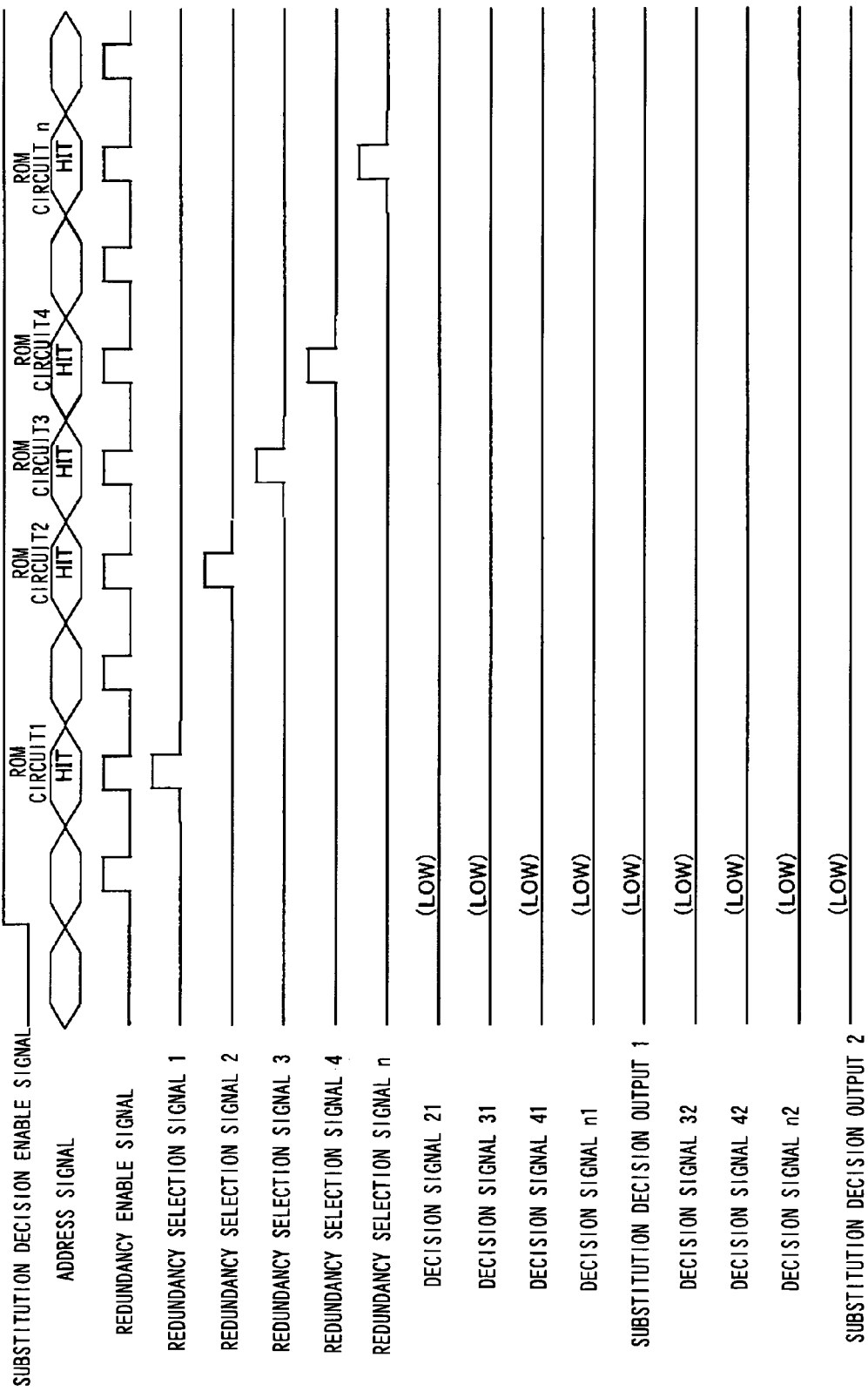
FIG. 8 is a timing diagram showing an example of the operation of the third example of the present invention.

FIG. 8 depicts a timing diagram showing the normal operation of the circuit of FIG. 7, during which the addresses are in a normal order. In this case, the decision signals 21 to n1 and the decision signals 32 to n2 of FIG. 7 are all LOW, with the operation being essentially the same as that of FIG. 5. When the substitution decision enable signal is LOW, the outputs of the SR flip-flops, associated with the respective redundancy ROM circuits, and the SR flip-flops $7_1$, $7_2$ for substitution decision latches, are all reset to LOW. When the substitution decision enable signal is HIGH, and the redundancy selection signals 1 to n are LOW, the outputs of the AND circuits $3_{21}$ to $3_{n1}$ are LOW, the decision signals 21, 31, . . . , n1 are LOW and the substitution decision output 1 is LOW.

When the redundancy selection signal 1 of the first redundancy ROM circuit $1_1$ has become HIGH, as in 'ROM circuit 1 HIT' of FIG. 8, the output of the first SR flip-flop, associated with the first redundancy ROM circuit $1_1$, is reset. When, under this condition, the redundancy selection signal 2 of the second redundancy ROM circuit $1_2$ (ROM circuit 2) is HIGH, as in 'ROM circuit 2 HIT' of FIG. 8, the decision signal 21, as an output signal of the associated AND circuit $3_{21}$, remains LOW. The output of the AND circuit $3_{21}$ also remains LOW. Hence, the decision signal 31, as an output signal of the OR circuit $4_{31}$, remains LOW, without dependency upon the value of the redundancy selection signal 3 of the third redundancy ROM circuit $1_3$ (ROM circuit 3). When the redundancy selection signal 3 of the third redundancy ROM circuit $1_3$ (ROM circuit 3) is HIGH (HIT of the address signal of FIG. 8), the decision signal 32, output from the AND circuit $3_{32}$, remains LOW. When the redundancy selection signal 4 of the fourth redundancy ROM circuit $1_4$ (ROM circuit 4) is HIGH (HIT of the address signal of FIG. 8), the output of the AND circuit $3_{42}$, remains LOW, and the decision signal 42, output from the AND circuit $3_{42}$, remains LOW. The decision signal 42, as an output signal of the OR circuit $4_{42}$, remains LOW and, at this time, the output of the OR circuit $4_{41}$ remains LOW, and so forth. Thus, if the sequence of the programming addresses of the first to n-th redundancy ROM circuits is the ascending order, the substitution decision output 1 is kept LOW, while the substitution decision output 2 is also kept LOW.

Figure 9:
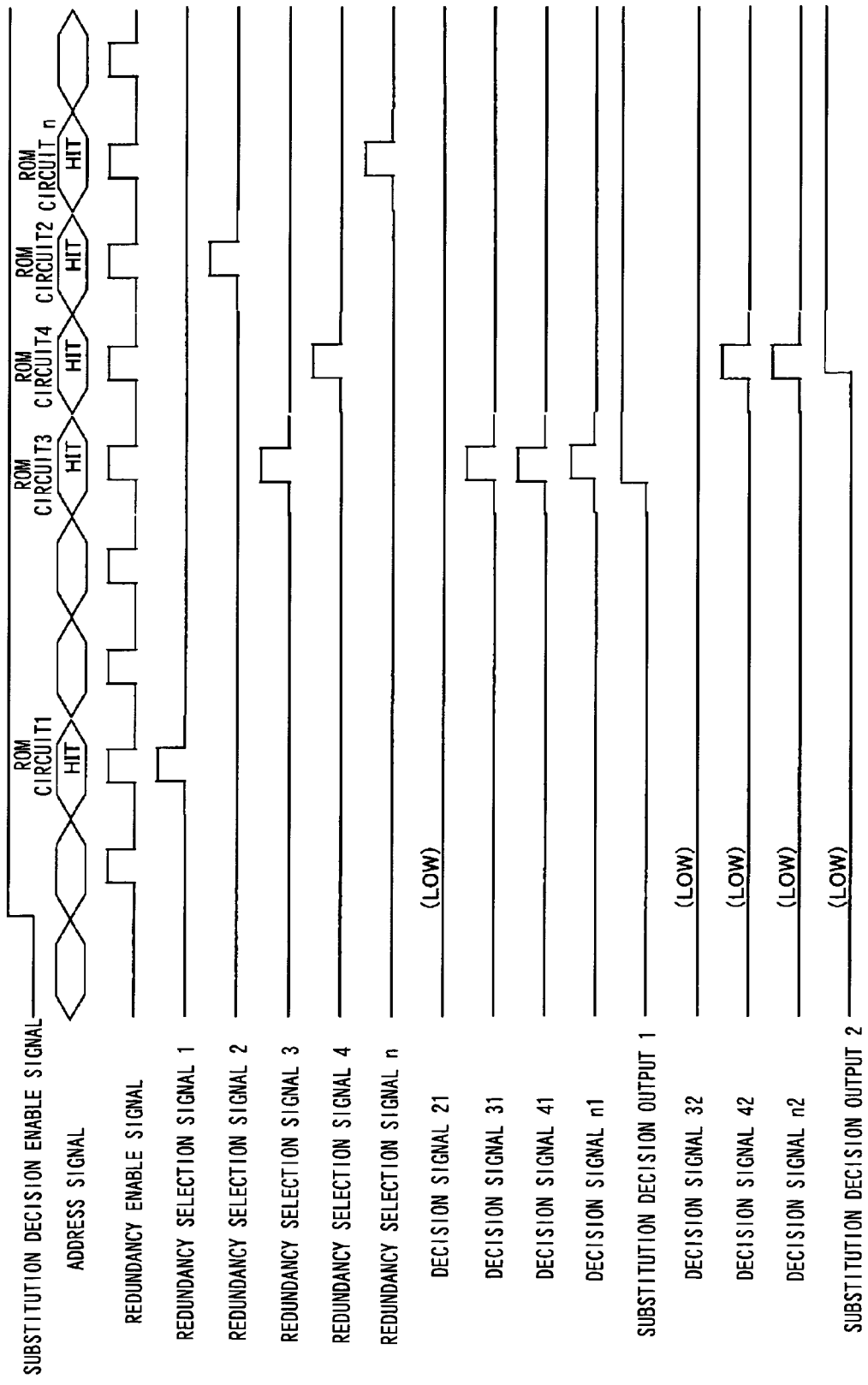
FIG. 9 is a timing diagram showing another example of the operation of the third example of the present invention.

FIG. 9 shows an example of the operation in case there has occurred a reversed sequence in the circuit of FIG. 7. Specifically, FIG. 9 shows a timing operation in which, as the addresses are input in the ascending order, the first redundancy ROM circuit $1_1$ has hit and, following the hits in the third and fourth redundancy ROM circuits 13 and 14, the second redundancy ROM circuit $1_2$ has hit. That is, in the second redundancy ROM circuit $1_2$ a fuse before the fuse to be blown has been blown due to an error during programming (laser cutting error) with the result that the largeness/smallness relationships are such that A1<A3<A4<A2.

When the third redundancy ROM circuit $1_3$ has hit and the redundancy selection signal 3 is HIGH, the second redundancy ROM circuit $1_2$ has not as yet hit. Hence, an output of the SR flip-flop of the second redundancy ROM circuit $1_2$ (output of the NOR circuit $2_{11}$) remains HIGH (in the set state). The decision signal 31, output from the OR circuit $4_{31}$, receiving, as an input, an output of the AND circuit $3_{21}$, that takes the logical AND of an output of the NOR circuit $2_{21}$ and the redundancy selection signal 3, goes HIGH, and is propagated through downstream side OR circuits. The decision signal n1, as an output signal of the last-stage OR circuit $4_{n-1}$, becomes HIGH to set the output of the SR flip-flop $7_1$ to HIGH. Since the first redundancy ROM circuit $1_1$ has already hit, its SR flip-flop has an output (output of the NOR circuit $2_{11}$) reset to LOW. Thus, the decision signal 32, which is an output signal of the AND circuit $3_{32}$, taking the logical AND of the output of the NOR circuit $2_{11}$ and the redundancy selection signal 3 of the third redundancy ROM circuit $1_3$, is LOW. When the redundancy ROM circuit $1_4$ has hit and the redundancy selection signal 4 has become HIGH, the second redundancy ROM circuit $1_2$ has not as yet hit. Hence, an output of the SR flip-flop of the second redundancy ROM circuit $1_2$ (output of the NOR circuit $2_{21}$) remains HIGH (in the set state). Thus, the decision signal 42, as an output signal of the OR circuit $4_{32}$, that receives an output of the AND circuit $3_{42}$, taking a logical AND of the output of the NOR circuit $2_{21}$ and the redundancy selection signal 4, goes HIGH and propagates through the downstream side OR circuits. The decision signal n2, output from the OR circuit $4_{n-2}$, goes HIGH to set the output of the SR flip-flop 72 to HIGH.

FIG. 10 shows an example of the operation in which the sequence reversal has occurred in the circuit of FIG. 7, that is, the operation in which, as the addresses are input in an ascending order, the first redundancy ROM circuit $1_1$ hits, and then the fourth, second and third redundancy ROM circuits $1_4$, $1_2$ and $1_3$ hit in this order. That is, non-cutting has occurred in the fourth redundancy ROM circuit, with the result that the largeness/smallness relationships of the values of addresses A1 to A4 programmed in the first to fourth redundancy ROM circuits are such that A1<A4<A2<A3.

When the fourth redundancy ROM circuit $1_4$ has hit and its redundancy selection signal 4 has become HIGH, the third redundancy ROM circuit $1_3$ has as yet not hit. Thus, the output of the SR flip-flop of the third redundancy ROM circuit $1_3$ (output of the NOR circuit $2_{31}$) remains HIGH (in the set state). Thus, the decision signal 41, as an output signal of the OR circuit $4_{41}$ that receives an output of the AND circuit $3_{31}$ which takes a logical AND of the output of the NOR circuit $2_{31}$ and the redundancy selection signal 4, goes HIGH and propagates through the downstream side OR circuits. The decision signal n1, as an output signal of the last-stage OR circuit $4_{n-1}$ becomes HIGH to set the output of the SR flip-flop $7_1$ to HIGH.

When the redundancy selection signal 4 of the fourth redundancy ROM circuit $1_4$ is HIGH, the second redundancy ROM circuit $1_2$ has not as yet hit. Hence, an output of the SR flip-flop of the second redundancy ROM circuit $1_2$ (output of the NOR circuit $2_{21}$) remains HIGH (in the set state). The decision signal 42, output from the OR circuit $4_{42}$ that receives as an input, an output of the AND circuit $3_{42}$ which takes the logical AND of an output of the NOR circuit $2_{21}$ and the redundancy selection signal 4, goes HIGH, and propagates through downstream side OR circuits. The decision signal n2, as an output signal of the last-stage OR circuit $4_{n-2}$, becomes HIGH to set the output of the SR flip-flop $7_2$ to HIGH.

In the foregoing description of the present invention, repair addresses are programmed in the ascending order from the first redundancy ROM circuit to the n-th redundancy ROM circuit. However, the array of the first to n-th redundancy ROM circuits $1_1$ to $1_n$ as well as the programming sequence is arbitrary. Thus, it is sufficient that, during testing, addresses are generated in the ascending order from the first redundancy ROM circuit to the n-th redundancy ROM circuit. If the n-th redundancy ROM circuit is associated with the smaller number side address, it is sufficient to provide the SR flip-flop associated with the first redundancy ROM circuit of FIG. 1 in association with the n-th redundancy ROM circuit and to provide the SR flip-flop associated with the n-th redundancy ROM circuit of FIG. 1 and the latch circuits for the substitution decision outputs in association with the first redundancy ROM circuit.

The present invention may well be applied to optional sequence detection circuits or to sequence monitoring circuits, configured for verifying, responsive to a control signal, such as a selection signal, whether or not a plural number of circuits, designed to output signals in a predetermined order, output signals in the preset normal order, and for detecting that signals have been output in a reverse order.

For example, the present invention may be applied to a decision circuit in which the redundancy ROM circuit of FIG. 1 is changed to plural circuits, outputting output signals in the activated state in a preset sequence based on the input signal and which is designed to decide whether or not there is sequence reversal of the outputting sequence from the plural circuits. The decision circuit may then be such a circuit including first to n-th SR flip-flops associated with the first to n-th redundancy memory circuits, respectively, the first to n-th SR flip-flops being set and reset by a substitution decision enable signal controlling a substitution decision test and by redundancy selection signals from the first to n-th redundancy memory circuits, respectively. Outputs of the first to n-th SR flip-flops are set to an activated state before the substitution decision enable signal is in an activated state, and outputs of the SR flip-flops, associated with the redundancy memory circuits, are reset if, in the activated state of the substitution decision enable signal, a redundancy selection signal is output from the redundancy memory circuit. The decision circuit may also include first to (n−1)th logic circuits each receiving, as first and second input signals, a redundancy selection signal from each of the second to n-th redundancy memory circuits and an output of the SR flip-flop associated with the redundancy memory circuit of the previous stage. The first to (n−1)th logic circuits each output a decision signal in an activated state if the first and second input signals are both in the activated state, while outputting a decision signal in an activated state otherwise. The decision circuit may also include an n-th logic circuit receiving decision signals from the first to (n−1)th logic circuits to output a signal in an activated state and a signal in an inactivated state if the decision signals are all in inactivated state and at least one of the decision signals is in an activated state, respectively. The decision circuit may also include an SR flip-flop, as a substitution decision latch, set and reset by an output of the n-th logic circuit and by the substitution decision enable signal, respectively. An output of the SR flip-flop as substitution decision latch is a substitution decision result. The SR flip-flop as substitution decision latch is reset before the substitution decision enable signal is activated and has an output set to an activated state in case the substitution decision enable signal is in the activated state and the output of the n-th logic circuit is in the inactivated state.

Although the present invention has so far been described with reference to preferred examples, the present invention is not to be restricted to the examples. It is to be appreciated that those skilled in the art can change or modify the examples without departing from the scope and spirit of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
a first redundancy ROM circuit storing a first redundancy address, receiving an input address, and comparing the input address with the first redundancy address to output a first redundancy selection signal, the first redundancy selection signal takes an active level when the input address is coincident with the first redundancy address and takes an inactive level when the input address is incoincident with the first redundancy address;
a second redundancy ROM circuit storing a second redundancy address, receiving the input address, and comparing the input address with the second redundancy address to output a second redundancy selection signal, the second redundancy selection signal takes the active level when the input address is coincident with the second redundancy address and takes the inactive level when the input address is incoincident with the second redundancy address;
a third redundancy ROM circuit storing a third redundancy address, receiving the input address, and comparing the input address with the third redundancy address to output a third redundancy selection signal, the third redundancy selection signal takes the active level when the input address is coincident with the third redundancy address and takes an inactive level when the input address is incoincident with the third redundancy address;
a first local decision circuit coupled to the first and second redundancy ROM circuits to receive the first and second redundancy selection signals, outputting a first error signal when the first redundancy selection signal takes the inactive level and the second redundancy selection signal takes the active level;
a second local decision circuit coupled to the second and third redundancy ROM circuits to receive the second and third redundancy selection signals, outputting a second error signal when the second redundancy selection signal takes the inactive level and the third redundancy selection signal takes the active level; and
a main decision circuit coupled to the first and second local decision circuit, outputting a main error signal in response to receive at least one of the first and second error signals.

2. The semiconductor device as claimed in claim 1, wherein the first local decision circuit includes a first SR flip-flop being set when the first redundancy selection signal takes the active level and the second local decision circuit includes a second SR flip-flop being set when the second redundancy selection signal takes the active level.

3. The semiconductor device as claimed in claim 2, further comprising a reset circuit coupled to the first and second SR flip-flops to reset the first and second SR flip-flops.

4. The semiconductor device as claimed in claim 2, wherein each of the first, second and third redundancy addresses is an associated one of column addresses.

5. The semiconductor device as claimed in claim 1, wherein each of the first, second and third redundancy addresses is an associated one of row redundancy addresses.

6. A method comprising:
comparing an input address with a first redundancy address to output a first redundancy selection signal, the first redundancy selection signal takes an active level when the input address is coincident with the first redundancy address and takes an inactive level when the input address is incoincident with the first redundancy address;
comparing the input address with a second redundancy address to output a second redundancy selection signal, the second redundancy selection signal takes an active level when the input address is coincident with the second redundancy address and takes an inactive level when the input address is incoincident with the second redundancy address;
comparing the input address with a third redundancy address to output a third redundancy selection signal, the third redundancy selection signal takes an active level when the input address is coincident with the third redundancy address and takes an inactive level when the input address is incoincident with the third redundancy address;
producing a first error signal that takes an active level when the first redundancy selection signal takes the inactive level and the second redundancy selection signal takes the active level and an inactive level when the first redundancy selection signal takes the active level and the second redundancy selection signal takes the inactive level, or when each of the first and second redundancy selection signals takes the active level, or when each of the first and second redundancy selection signals takes the inactive level;
producing a second error signal that takes an active level when the second redundancy selection signal takes the inactive level and the third redundancy selection signal takes the active level and an inactive level when the second redundancy selection signal takes the active level and the third redundancy selection signal takes the inactive level, or when each of the second and third redundancy selection signals takes the active level, or when each of the second and third redundancy selection signals takes the inactive level; and
detecting a main error when at least one of the first and second error signals takes the active level.

7. A method comprising;
initializing a first signal to take a first level;
comparing an input address with a first address to change the first signal from the first level to a second level when the input address is coincident with the first address and maintain the first signal at the first level when the input address is incoincident with the first address;
comparing the input address with a second address to produce a second signal that takes a first state when the input address is coincident with the second address and takes a second state when the input address is incoincident with the second address;
producing a third signal in response to the first and second signals, the third signal taking an inactive level when the first signal takes the second level, the third signal further taking the inactive level when the first signal takes the first level and the second signal takes the second state, and the third signal taking an active level when the first signal takes the first level and the second signal takes the first state, whereby the third signal takes the inactive level when the input address takes the first address prior to the second address and the active level when the input address takes the second address prior to the first address;

initializing a fourth signal to take a first level;

changing the fourth signal from the first level to the second level when the input address is coincident with the second address and maintain the fourth signal at the first level when the input address is incoincident with the second address;

comparing the input address with a third address to produce a fifth signal that takes the first state when the input address is coincident with the third address and takes the second state when the input address is incoincident with the third address; and producing a sixth signal in response to the fourth and fifth signals, the sixth signal taking the inactive level when the fourth signal takes the second level, the sixth signal further taking the inactive level when the fourth signal takes the first level and the fifth signal takes the second state, and the sixth signal taking the active level when the fourth signal takes the first level and the fifth signal takes the first state, whereby the sixth signal takes the inactive level when the input address takes the second address prior to the third address and the active level when the input address takes the third address prior to the second address.

8. The method as claimed in claim 7, the initializing the first signal is performed substantially simultaneously with the initializing the fourth signal.

9. The method as claimed in claim 8, further comprising:

storing a first redundancy address as the first address prior to the comparing the input address with the first address;

storing a second redundancy address as the second address prior to the comparing the input address with the second address; and storing a third redundancy address as the third address prior to the comparing the input address with the third address.

* * * * *